(12) United States Patent
Kim et al.

(10) Patent No.: US 12,249,651 B2
(45) Date of Patent: Mar. 11, 2025

(54) SEMICONDUCTOR DEVICE

(71) Applicant: Samsung Electronics Co., Ltd., Suwon-si (KR)

(72) Inventors: Hyuncheol Kim, Seoul (KR); Yongseok Kim, Suwon-si (KR); Dongsoo Woo, Seoul (KR); Kyunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/741,219

(22) Filed: May 10, 2022

(65) Prior Publication Data
US 2023/0075559 A1 Mar. 9, 2023

(30) Foreign Application Priority Data
Sep. 9, 2021 (KR) .......... 10-2021-0120539

(51) Int. Cl.
*H01L 29/78* (2006.01)
*H01L 29/10* (2006.01)
*H01L 29/417* (2006.01)

(52) U.S. Cl.
CPC ...... *H01L 29/7851* (2013.01); *H01L 29/1033* (2013.01); *H01L 29/41791* (2013.01)

(58) Field of Classification Search
CPC ............ H01L 29/7851; H01L 29/1033; H01L 29/41791; H01L 29/0673; H01L 29/267; H01L 29/423; H01L 29/66227; H01L 29/84
See application file for complete search history.

(56) References Cited

U.S. PATENT DOCUMENTS

| | | | |
|---|---|---|---|
| 8,629,483 B2 | 1/2014 | Juengling | |
| 8,765,554 B2 | 7/2014 | Imada et al. | |
| 9,240,478 B2 | 1/2016 | Chang et al. | |
| 10,056,456 B2 | 8/2018 | Then et al. | |

(Continued)

FOREIGN PATENT DOCUMENTS

| | | |
|---|---|---|
| CN | 103094326 A | 5/2013 |
| CN | 109962106 A | 7/2019 |

(Continued)

OTHER PUBLICATIONS

Das, Saptarshi. "Two Dimensional Electrostrictive Field Effect Transistor (2D-EFET): A sub-60mV/decade Steep Slope Device with High ON current." Scientific reports Oct. 10, 2016, vol. 6, p. 34811.

(Continued)

*Primary Examiner* — Douglas W Owens
(74) *Attorney, Agent, or Firm* — Muir Patent Law, PLLC

(57) ABSTRACT

A semiconductor device includes: a channel; a gate structure on the channel; a first source/drain arranged at a first end of the channel and including a metal; a first tunable band-gap layer arranged between the channel and the first source/drain and having a band gap that changes according to stress; a first electrostrictive layer between the gate structure and the first tunable band-gap layer, the first electrostrictive layer having a property of being deformed based on and upon application of an electric field; and a second source/drain at a second end of the channel.

20 Claims, 39 Drawing Sheets

(56) References Cited

U.S. PATENT DOCUMENTS

| | | | |
|---|---|---|---|
| 10,217,819 B2* | 2/2019 | Lee | H01L 29/0665 |
| 10,283,590 B2 | 5/2019 | Yeh et al. | |
| 10,964,824 B2* | 3/2021 | Das | H01L 29/1033 |
| 10,991,797 B2 | 4/2021 | Zhang et al. | |
| 2011/0121400 A1 | 5/2011 | Larrieu et al. | |
| 2014/0061724 A1 | 3/2014 | Huang et al. | |
| 2018/0374962 A1* | 12/2018 | Das | H01L 29/778 |

FOREIGN PATENT DOCUMENTS

| | | |
|---|---|---|
| CN | 108933174 B | 9/2021 |
| TW | 201246541 A | 11/2012 |

OTHER PUBLICATIONS

Extended European Search Report issued Feb. 2, 2023 for corresponding EP Patent Application No. 22194350.9.
Yimnirun et al., "Electrostrictive Strain in Low-Permittivity Dielectrics," Journal of Electroceramics, 2002, pp. 87-98.

* cited by examiner

SEMICONDUCTOR DEVICE

CROSS-REFERENCE TO RELATED APPLICATION

This application is based on and claims priority under 35 U.S.C. § 119 to Korean Patent Application No. 10-2021-0120539, filed on Sep. 9, 2021, in the Korean Intellectual Property Office, the disclosure of which is incorporated by reference herein in its entirety.

BACKGROUND

The inventive concept relates to a semiconductor device. More particularly, the inventive concept relates to a transistor and a semiconductor device including the transistor.

Metal-oxide-semiconductor field-effect transistors (MOSFETs) have been widely used in the field of semiconductors. However, issues such as gate-induced drain leakage (GIDL) may occur along with the reduction in sizes of MOSFETs. In addition, there may be a reduction in a ratio of ON-current to OFF-current along with the reduction in sizes of MOSFETs. Further, in theory, the subthreshold swing (SS) of MOSFETs is not able to be less than 60 mV/decade. There is a need for a new transistor, which may overcome such limits of MOSFETs, and a memory device including the transistor.

SUMMARY

Aspects of the inventive concept provide a semiconductor device having a high ratio of ON-current to OFF-current and a reduced gate-induced drain leakage (GIDL). Aspects of the inventive concept also provide a semiconductor device having a subthreshold swing (SS) that is less than 60 mV/decade.

According to an aspect of the inventive concept, a semiconductor device includes: a channel; a gate structure on the channel; a first source/drain at a first end of the channel, the first source/drain including a metal; a first tunable band-gap layer between the channel and the first source/drain, the first tunable band-gap layer having a bandgap that varies according to stress; a first electrostrictive layer between the gate structure and the first tunable band-gap layer, the first electrostrictive layer having a property of being deformed based on and upon application of an electric field; and a second source/drain at a second end of the channel.

According to an aspect of the inventive concept, a semiconductor device includes: a semiconductor substrate having a recess; a gate structure in the recess of the semiconductor substrate; a first source/drain on the semiconductor substrate at a first side of the gate structure, the first source/drain including a metal; a 2-dimensional material layer between the semiconductor substrate and the first source/drain; an electrostrictive layer between the gate structure and the 2-dimensional material layer, the electrostrictive layer having a property of being deformed based on and upon application of an electric field; and a second source/drain on the semiconductor substrate at a second side of the gate structure opposite the first side.

According to an aspect of the inventive concept, a semiconductor device includes: a semiconductor substrate having a recess; a gate structure in the recess of the semiconductor substrate; a tunable band-gap layer between the semiconductor substrate and the gate structure, the tunable band-gap layer having a band-gap that varies according to stress; an electrostrictive layer between the tunable band-gap layer and the gate structure, the electrostrictive layer having a property of being deformed based on and upon application of an electric field; a first source/drain at a first end of the tunable band-gap layer; and a second source/drain at a second end of the tunable band-gap layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
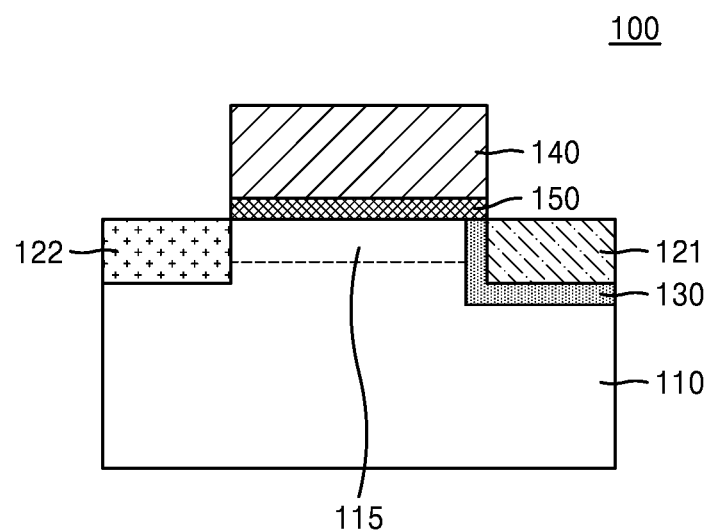
FIG. 1 is a cross-sectional view illustrating a semiconductor device according to an embodiment of the inventive concept.

FIG. 1 is a cross-sectional view illustrating a semiconductor device 100 according to an embodiment of the inventive concept. The semiconductor device 100 may be, for example, a semiconductor chip, such as a semiconductor memory chip or logic chip, formed on a die from a wafer. The semiconductor device 100 may be, for example, a semiconductor package including a package substrate and one or more semiconductor chips mounted thereon, wherein the one or more semiconductor chips include a semiconductor memory chip or logic chip formed on a semiconductor die.

Referring to FIG. 1, the semiconductor device 100 may include a channel 115, a gate structure 140, a first source/drain 121, a tunable band-gap layer 130, an electrostrictive layer 150, and a second source/drain 122. The channel 115, gate structure 140, first source/drain 121, tunable band-gap layer 130, electrostrictive layer 150, and second source/drain 122 may form and be components of a transistor.

The channel 115 may be a portion of a substrate 110. The substrate 110 may be or may include a semiconductor material such as a Group IV semiconductor material, a Group III-V semiconductor material, or a Group II-VI semiconductor material. The Group IV semiconductor material may be or may include, for example, silicon (Si), germanium (Ge), or silicon (Si)-germanium (Ge). The Group III-V semiconductor material may be or may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may be or may include, for example, zinc telluride (ZnTe) or cadmium sulfide (CdS).

The gate structure 140 may be arranged over the channel 115. For example, the gate structure 140 may be arranged over the substrate 110. The gate structure 140 may include or may be formed of polysilicon, a metal, a metal silicide, or a combination thereof. For example, the gate structure 140 may include or may be formed of polysilicon, tungsten (W), titanium (Ti), cobalt (Co), tungsten silicide, titanium silicide, cobalt silicide, or a combination thereof. The gate structure 140 may be described simply as a gate or as a gate electrode.

The first source/drain 121, also described as a source/drain region or a source/drain layer, may be arranged at one end of the channel 115. The first source/drain 121 may be arranged on the substrate 110 at one side of the gate structure 140. The first source/drain 121 may include or may be formed of a metal. For example, the first source/drain 121 may include or may be formed of tungsten (W), aluminum (Al), or a combination thereof.

The tunable band-gap layer 130 may be arranged between the channel 115 and the first source/drain 121. The tunable band-gap layer 130 may be arranged between the substrate 110 and the first source/drain 121. The tunable band-gap layer 130 may have a band gap varying according to stress. For example, the tunable band-gap layer 130 may include or be formed of a 2-dimensional material. The tunable band-gap layer 130 may include or be formed of, for example, a transition metal dichalcogenide (TMD). For example, the tunable band-gap layer 130 may include or be formed of $MX_2$, wherein M is a transition metal such as molybdenum (Mo), tungsten (W), or tin (Sn), and X is a chalcogen element such as sulfur (S), selenium (Se), or tellurium (Te). The tunable band-gap layer 130 may include or be formed of a multi-layered 2-dimensional material. For example, the tunable band-gap layer 130 may include or be formed of a plurality of 2-dimensional material atomic layers, which are stacked on each other. In some embodiments, the tunable band-gap layer 130 conformally cover a side surface and top surface of the substrate 110, to form an "L" shape from a cross-sectional view.

The electrostrictive layer 150 may be arranged between the tunable band-gap layer 130 and the gate structure 140. In some embodiments, the electrostrictive layer 150 may further extend between the channel 115 and the gate structure 140. For example, in some embodiments, the electrostrictive layer 150 may extend between the substrate 110 and the gate structure 140. The electrostrictive layer 150 may be formed of a material that has a property of being deformed according to an electric field, for example, upon application of an electric field. The electrostrictive layer 150 may include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The electrostrictive layer 150 may be formed of or may include, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The second source/drain 122, also described as a source/drain region or a source/drain layer may be arranged at the other end (e.g., an opposite end) of the channel 115. The second source/drain 122 may be arranged on the substrate 110 at the other side (e.g., an opposite side) of the gate structure 140. The second source/drain 122 may include a doped semiconductor material of the substrate 110. For example, the second source/drain 122 may be formed of the substrate, doped with a dopant material.

An electric field may be applied to the electrostrictive layer 150 according to a voltage applied to the gate structure 140, and thus, the electrostrictive layer 150 may be deformed. For example, the deforming may include expanding, contracting, or other changes in shape or size. When the electrostrictive layer 150 is deformed, the stress applied to the tunable band-gap layer 130 is changed, and the bandgap of the tunable band-gap layer 130 may vary according to the stress. The electrostrictive layer 150 may serve as, and may be included as, a gate dielectric for the transistor, and may be described as an electrostrictive gate dielectric layer.

For example, when an ON-voltage is applied to the gate structure 140, the electrostrictive layer 150 may expand. When the electrostrictive layer 150 expands, stress is applied to the tunable band-gap layer 130, and the bandgap of the tunable band-gap layer 130 may decrease according to the stress. Accordingly, an Ohmic junction may be formed between the first source/drain 121, which includes the metal, and the tunable band-gap layer 130. Thus, contact resistance between the first source/drain 121 and the tunable band-gap layer 130 when the ON-voltage is applied to the gate structure 140 may be less than the contact resistance between the first source/drain 121 and the tunable band-gap layer 130 when an OFF-voltage is applied to the gate structure 140. Therefore, the semiconductor device 100 according to an embodiment of the inventive concept may have a high ratio of an ON-current to an OFF-current. For example, the ratio of the ON-current to the OFF-current of the semiconductor device 100 according to an embodiment of the inventive concept may be increased by as much as about 500%, as compared with a ratio of an ON-current to an OFF-current of a general metal-oxide-semiconductor field-effect transistor (MOSFET).

In addition, when the OFF-voltage is applied to the gate structure 140, the electrostrictive layer 150 may not be deformed. When the electrostrictive layer 150 is not deformed, stress may not be applied to the tunable band-gap layer 130. Accordingly, the band gap of the tunable band-gap layer 130 when the OFF-voltage is applied to the gate structure 140 may be greater than the band gap of the tunable band-gap layer 130 when the ON-voltage is applied to the gate structure 140. Therefore, the generation of electron-hole pairs may be reduced due to the increased band gap, and thus, gate-induced drain leakage (GIDL) may be reduced. For example, the GIDL of the semiconductor device 100 according to an embodiment of the inventive concept may be reduced by as much as about 30%, as compared with the GIDL of a general MOSFET (e.g., a MOSFET without an electrostrictive layer).

Figure 2:
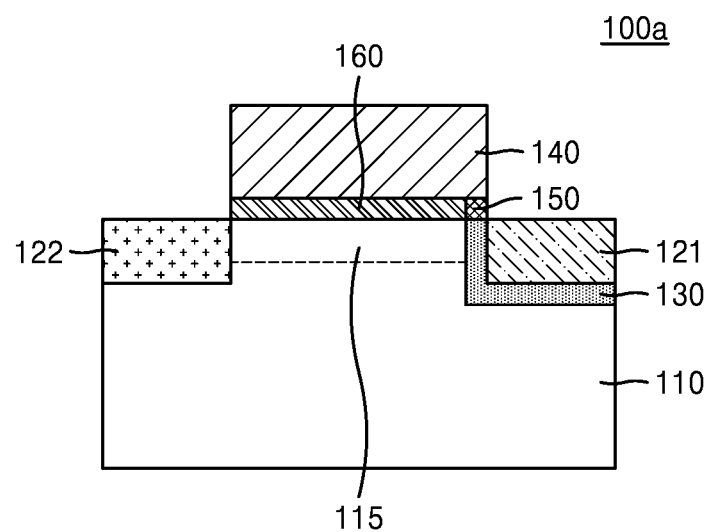
FIG. 2 is a cross-sectional view illustrating a semiconductor device according to an embodiment of the inventive concept.

FIG. 2 is a cross-sectional view illustrating a semiconductor device 100*a* according to an embodiment of the inventive concept. Hereinafter, differences between the semiconductor device 100 shown in FIG. 1 and the semiconductor device 100*a* shown in FIG. 2 will be described.

Referring to FIG. 2, the semiconductor device 100*a* may include a gate dielectric layer 160 between the gate structure 140 and the channel 115. The gate dielectric layer 160 may be arranged between the gate structure 140 and the substrate 110 and may contact the electrostrictive layer 150. The term "contact," as used herein, refers to a direct connection (i.e., touching) unless the context indicates otherwise. The gate dielectric layer 160 may include or be formed of silicon oxide, silicon nitride, a high-k material, or a combination thereof. The high-k material is a material having a dielectric constant that is greater than a dielectric constant of silicon oxide. The high-k material may be, for example, hafnium oxide ($HfO_2$), zirconium oxide ($ZrO_2$), aluminum oxide ($Al_2O_3$), hafnium aluminum oxide ($HfAlO_3$), tantalum oxide ($Ta_2O_3$), titanium oxide ($TiO_2$), or a combination thereof. In this case, the electrostrictive layer 150 may not be part of the gate dielectric layer, and may be horizontally adjacent to the gate dielectric layer 160, wherein both the electrostrictive layer 150 and the gate dielectric layer 160 are vertically between the substrate 110 and the gate structure 140. In this case a gate dielectric layer 160 may be further included along with the electrostrictive layer 150.

Figure 3:
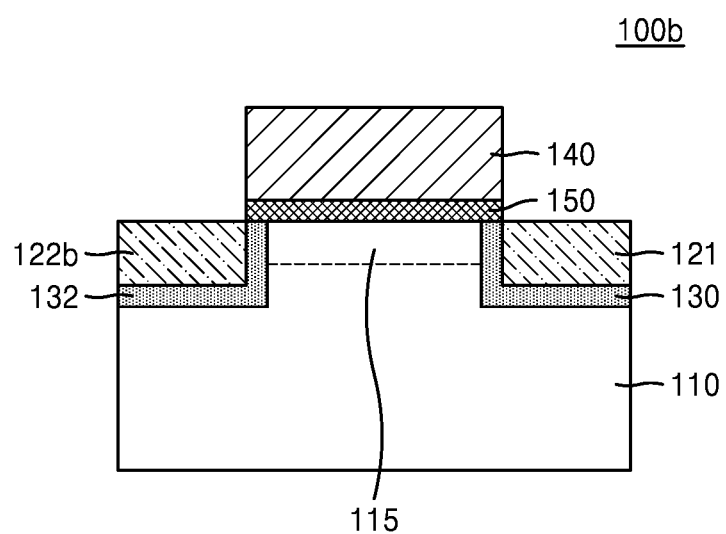
FIG. 3 is a cross-sectional view illustrating a semiconductor device according to an embodiment of the inventive concept.

FIG. 3 is a cross-sectional view illustrating a semiconductor device 100*b* according to an embodiment of the inventive concept. Hereinafter, differences between the semiconductor device 100 shown in FIG. 1 and the semiconductor device 100*b* shown in FIG. 3 will be described.

Referring to FIG. 3, a second source/drain 122*b* may include or be formed of a metal. For example, the second source/drain 122*b* may include or be formed of tungsten (W), aluminum (Al), or a combination thereof.

In addition, the semiconductor device 100*b* may further include an additional tunable band-gap layer 132 between the second source/drain 122*b* and the channel 115. The additional tunable band-gap layer 132 may be arranged between the substrate 110 and the second source/drain 122*b*. The additional tunable band-gap layer 132 may have a band gap varying according to stress. For example, the additional tunable band-gap layer 132 may include or be formed of a 2-dimensional material. The additional tunable band-gap layer 132 may include or be formed of, for example, a TMD. For example, the additional tunable band-gap layer 132 may include or be formed of $MX_2$, wherein M is a transition metal such as molybdenum (Mo), tungsten (W), or tin (Sn), and X is a chalcogen element such as sulfur (S), selenium (Se), or tellurium (Te). The additional tunable band-gap layer 132 may include or may be a multi-layered 2-dimensional material. For example, the additional tunable band-gap layer 132 may include or be formed of a plurality of 2-dimensional material atomic layers, which are stacked on each other. In some embodiments, the additional tunable band-gap layer 132 may be formed of the same materials and have the same shape as the tunable band-gap layer 130.

The electrostrictive layer 150 may further extend between the gate structure 140 and the additional tunable band-gap layer 132.

An electric field may be applied to the electrostrictive layer 150 according to a voltage applied to the gate structure 140, and thus, the electrostrictive layer 150 may be deformed. When the electrostrictive layer 150 is deformed, stress applied to each of the tunable band-gap layer 130 and the additional tunable band-gap layer 132 is changed, and band gaps of the tunable band-gap layer 130 and the additional tunable band-gap layer 132 may respectively vary according to the stress.

For example, when an ON-voltage is applied to the gate structure 140, the electrostrictive layer 150 may expand. When the electrostrictive layer 150 expands, stress is applied to each of the tunable band-gap layer 130 and the additional tunable band-gap layer 132, and the respective band gaps of the tunable band-gap layer 130 and the additional tunable band-gap layer 132 may decrease according to the stress. Accordingly, an Ohmic junction may be formed between the first source/drain 121, which includes the metal, and the tunable band-gap layer 130. In addition, an Ohmic junction may be formed between the second source/drain 122*b*, which includes the metal, and the additional tunable band-gap layer 132. Thus, the contact resistance between the first source/drain 121 and the tunable band-gap layer 130 when the ON-voltage is applied to the gate structure 140 may be less than the contact resistance between the first source/drain 121 and the tunable band-gap layer 130 when the OFF-voltage is applied to the gate structure 140. In addition, contact resistance between the second source/drain 122b and the additional tunable band-gap layer 132 when the ON-voltage is applied to the gate structure 140 may be less than the contact resistance between the second source/drain 122b and the additional tunable band-gap layer 132 when the OFF-voltage is applied to the gate structure 140. Therefore, the semiconductor device 100b according to an embodiment of the inventive concept may have a high ratio of an ON-current to an OFF-current.

In addition, when the OFF-voltage is applied to the gate structure 140, the electrostrictive layer 150 may not be deformed. When the electrostrictive layer 150 is not deformed, stress may not be applied to each of the tunable band-gap layer 130 and the additional tunable band-gap layer 132. Accordingly, the band gap of the tunable band-gap layer 130 when the OFF-voltage is applied to the gate structure 140 may be greater than the band gap of the tunable band-gap layer 130 when the ON-voltage is applied to the gate structure 140. In addition, the band gap of the additional tunable band-gap layer 132 when the OFF-voltage is applied to the gate structure 140 may be greater than the band gap of the additional tunable band-gap layer 132 when the ON-voltage is applied to the gate structure 140. Therefore, the generation of electron-hole pairs may be reduced due to the increased band gap, and thus, the GIDL may be reduced. The tunable band-gap layer 130 may be described as a first tunable band-gap layer, and the additional tunable band-gap layer 132 may be described as a second tunable band-gap layer. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 4:
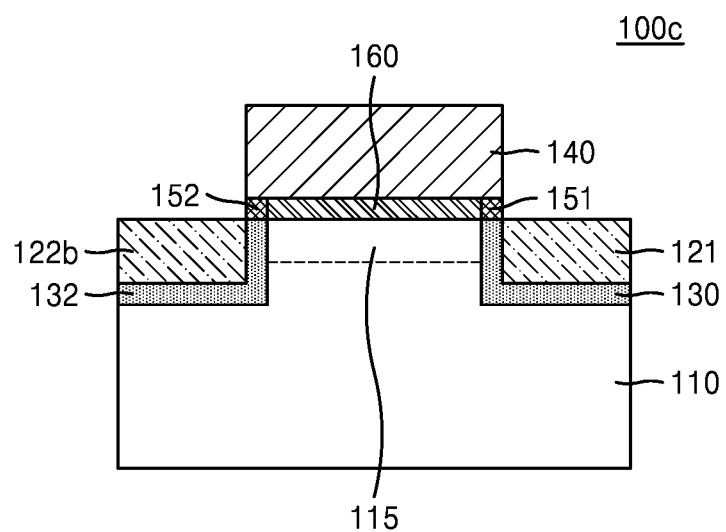
FIG. 4 is a cross-sectional view illustrating a semiconductor device according to an embodiment of the inventive concept.

FIG. 4 is a cross-sectional view illustrating a semiconductor device 100c according to an embodiment of the inventive concept. Hereinafter, differences between the semiconductor device 100b shown in FIG. 3 and the semiconductor device 100c shown in FIG. 4 will be described.

Referring to FIG. 4, the semiconductor device 100c may include a first electrostrictive layer 151 and a second electrostrictive layer 152, instead of the electrostrictive layer 150 shown in FIG. 3. The first electrostrictive layer 151 may be arranged between the gate structure 140 and the tunable band-gap layer 130, to overlap from a plan view the gate structure 140 and the tunable band-gap layer 130. The second electrostrictive layer 152 may be arranged between the gate structure 140 and the additional tunable band-gap layer 132, to overlap from a plan view the gate structure 140 and the tunable band-gap layer 130. The first electrostrictive layer 151 and the second electrostrictive layer 152 may be deformed according to an electric field (e.g., based on a strength of an electric field). The first electrostrictive layer 151 and the second electrostrictive layer 152 may each include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The first electrostrictive layer 151 and the second electrostrictive layer 152 may each include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$. The first electrostrictive layer 151 and the second electrostrictive layer 152 may be formed of the same material, or may be formed of different materials.

The semiconductor device 100c may further include the gate dielectric layer 160 between the first electrostrictive layer 151 and the second electrostrictive layer 152. The gate dielectric layer 160 may be arranged between the channel 115 and the gate structure 140. For example, the gate dielectric layer 160 may be arranged between the substrate 110 and the gate structure 140. The gate dielectric layer 160 may include or be formed of silicon oxide, silicon nitride, a high-k material, or a combination thereof.

An electric field may be applied to the first electrostrictive layer 151 and the second electrostrictive layer 152 according to the voltage applied to the gate structure 140, and thus, the first electrostrictive layer 151 and the second electrostrictive layer 152 may be deformed. When the first electrostrictive layer 151 and the second electrostrictive layer 152 are deformed, the stress applied to each of the tunable band-gap layer 130 and the additional tunable band-gap layer 132 is changed, and the band gaps of the tunable band-gap layer 130 and the additional tunable band-gap layer 132 may respectively vary according to the stress.

For example, when the ON-voltage is applied to the gate structure 140, the first electrostrictive layer 151 and the second electrostrictive layer 152 may expand. When the first electrostrictive layer 151 and the second electrostrictive layer 152 expand, stress is applied to each of the tunable band-gap layer 130 and the additional tunable band-gap layer 132, and the respective band gaps of the tunable band-gap layer 130 and the additional tunable band-gap layer 132 may decrease according to the stress. Accordingly, an Ohmic junction may be formed between the first source/drain 121, which includes the metal, and the tunable band-gap layer 130. In addition, an Ohmic junction may be formed between the second source/drain 122b, which includes the metal, and the additional tunable band-gap layer 132. Thus, the contact resistance between the first source/drain 121 and the tunable band-gap layer 130 when the ON-voltage is applied to the gate structure 140 may be less than the contact resistance between the first source/drain 121 and the tunable band-gap layer 130 when the OFF-voltage is applied to the gate structure 140. In addition, contact resistance between the second source/drain 122b and the additional tunable band-gap layer 132 when the ON-voltage is applied to the gate structure 140 may be less than the contact resistance between the second source/drain 122b and the additional tunable band-gap layer 132 when the OFF-voltage is applied to the gate structure 140. Therefore, the semiconductor device 100c according to an embodiment of the inventive concept may have a high ratio of an ON-current to an OFF-current.

In addition, when the OFF-voltage is applied to the gate structure 140, the first electrostrictive layer 151 and the second electrostrictive layer 152 may not be deformed. When the first electrostrictive layer 151 and the second electrostrictive layer 152 are not deformed, the stress may not be applied to each of the tunable band-gap layer 130 and the additional tunable band-gap layer 132. Accordingly, the band gap of the tunable band-gap layer 130 when the OFF-voltage is applied to the gate structure 140 may be greater than the band gap of the tunable band-gap layer 130 when the ON-voltage is applied to the gate structure 140. In addition, the band gap of the additional tunable band-gap layer 132 when the OFF-voltage is applied to the gate structure 140 may be greater than the band gap of the additional tunable band-gap layer 132 when the ON-voltage is applied to the gate structure 140. Therefore, the generation of electron-hole pairs may be reduced due to the increased band gap, and thus, the GIDL may be reduced.

Figure 5A:
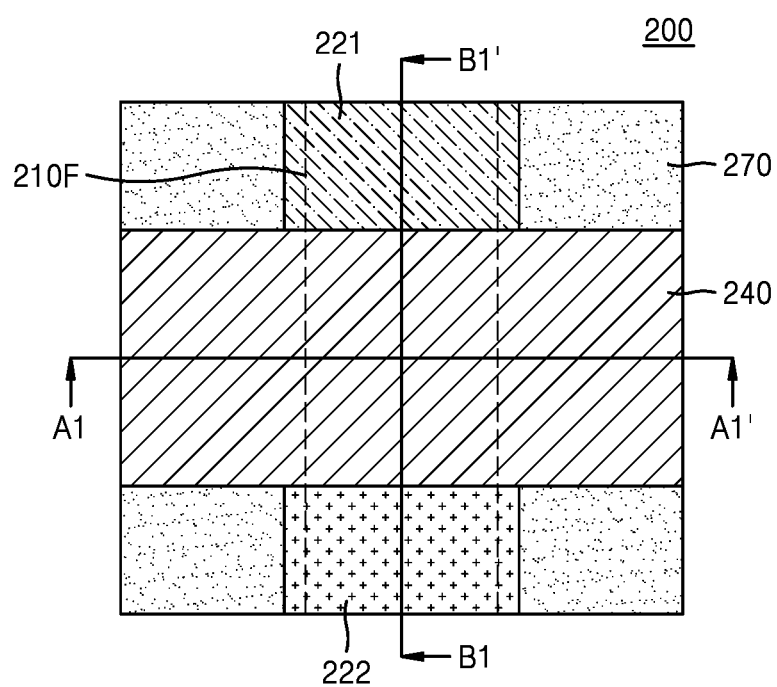
FIG. 5A is a plan view illustrating a semiconductor device according to an embodiment of the inventive concept.
Figure 5B:
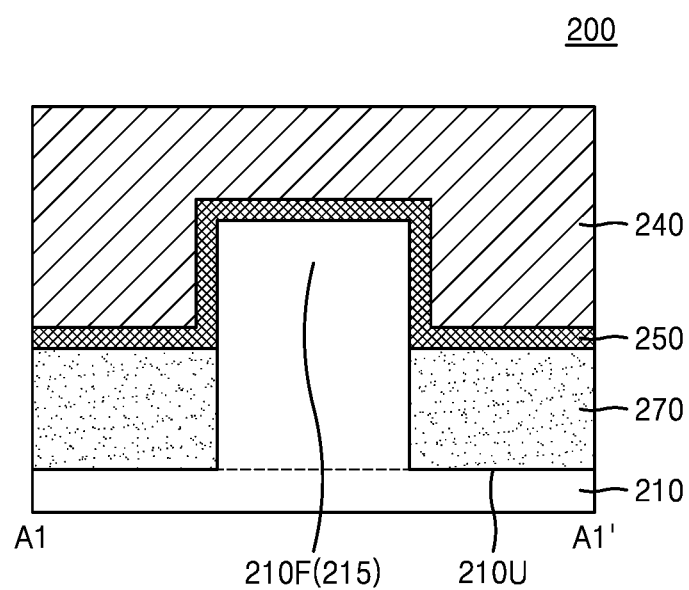
FIG. 5B is a cross-sectional view illustrating a semiconductor device according to an embodiment of the inventive concept, taken along a line A1-A1' of FIG. 5A.
Figure 5C:
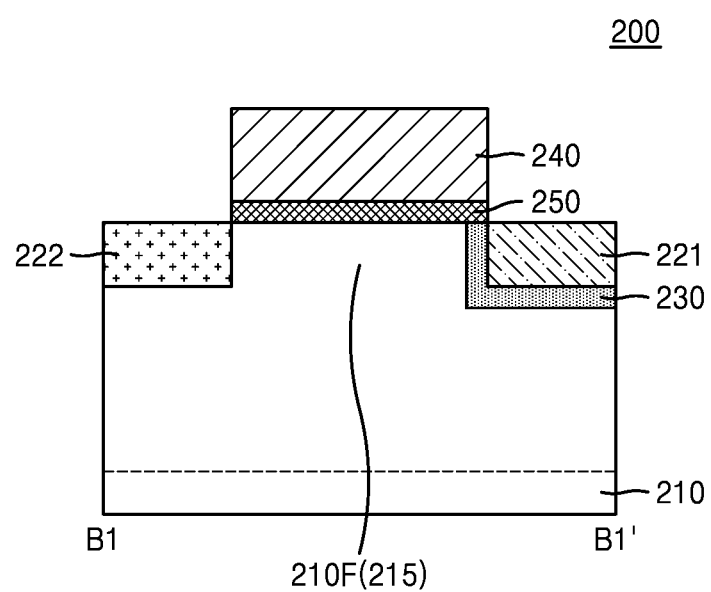
FIG. 5C is a cross-sectional view illustrating a semiconductor device according to an embodiment of the inventive concept, taken along a line B1-B1' of FIG. 5A.

FIG. 5A is a plan view illustrating a semiconductor device 200 according to an embodiment of the inventive concept. FIG. 5B is a cross-sectional view illustrating the semiconductor device 200 according to an embodiment of the inventive concept, taken along a line A1-A1' of FIG. 5A. FIG. 5C is a cross-sectional view illustrating the semiconductor device 200 according to an embodiment of the inventive concept, taken along a line B1-B1' of FIG. 5A.

Referring to FIGS. 5A to 5C, the semiconductor device 200 may include a channel 215, a gate structure 240, a first source/drain 221, a tunable band-gap layer 230, an electrostrictive layer 250, a second source/drain 222, and a device isolation layer 270.

A substrate 210 may have a main surface 210U. The substrate 210 may have a fin structure 210F protruding from the main surface 210U of the substrate 210. The fin structure 210F may be formed by etching the substrate 210 or formed by epitaxial growth on the substrate 210. The channel 215 may include at least a portion of the fin structure 210F. The substrate 210 may include a semiconductor material.

The gate structure 240 may be arranged over the channel 215. As shown in FIG. 5A, an extension direction of the gate structure 240 may intersect with an extension direction of the fin structure 210F (e.g., lengthwise extension directions, wherein the length in the lengthwise extension direction is greater than a width in a horizontal direction perpendicular to the lengthwise extension direction). The gate structure 240 may include or be formed of polysilicon, a metal, a metal silicide, or a combination thereof. For example, the gate structure 240 may include or be formed of polysilicon, tungsten (W), titanium (Ti), cobalt (Co), tungsten silicide, titanium silicide, cobalt silicide, or a combination thereof.

The first source/drain 221 may be arranged at one end of the channel 215. The first source/drain 221 may be arranged on the fin structure 210F of the substrate 210 at one side of the gate structure 240. The first source/drain 221 may include or be formed of a metal. For example, the first source/drain 221 may include tungsten (W), aluminum (Al), or a combination thereof.

The tunable band-gap layer 230 may be arranged between the channel 215 and the first source/drain 221. The tunable band-gap layer 230 may be arranged between the fin structure 210F of the substrate 210 and the first source/drain 221. The tunable band-gap layer 230 may have a band gap varying according to stress. For example, the tunable band-gap layer 230 may include or be formed of a 2-dimensional material. The tunable band-gap layer 230 may include or be formed of, for example, a TMD. For example, the tunable band-gap layer 230 may include or may be $MX_2$, wherein M is a transition metal such as molybdenum (Mo), tungsten (W), or tin (Sn), and X is a chalcogen element such as sulfur (S), selenium (Se), or tellurium (Te). The tunable band-gap layer 230 may include or be formed of a multi-layered 2-dimensional material. For example, the tunable band-gap layer 230 may include a plurality of 2-dimensional material atomic layers, which are stacked on each other.

The electrostrictive layer 250 may be arranged between the tunable band-gap layer 230 and the gate structure 240. In some embodiments, the electrostrictive layer 250 may further extend between the channel 215 and the gate structure 240. For example, in some embodiments, the electrostrictive layer 250 may extend between the fin structure 210F of the substrate 210 and the gate structure 240, and may extend along a top surface and side surfaces of the fin structure 210F. The electrostrictive layer 250 may be deformed according to an electric field (e.g., based on a strength of an electric field). The electrostrictive layer 250 may include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The electrostrictive layer 250 may include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The second source/drain 222 may be arranged at the other end of the channel 215. The second source/drain 222 may be arranged on the substrate 210 at the other side of the gate structure 240. The second source/drain 222 may include a doped semiconductor material, for example.

The device isolation layer 270 may be arranged on the main surface 210U of the substrate 210. The fin structure 210F of the substrate 210 may protrude from the device isolation layer 270. The device isolation layer 270 may include or be formed of silicon oxide, silicon nitride, a low-k material, or a combination thereof. The low-k material refers to a material having a smaller dielectric constant than silicon oxide, and the low-k material may include or may be, for example, flowable oxide (FOX), torene silazene (TOSZ), undoped silica glass (USG), borosilica glass (BSG), phosphosilica glass (PSG), borophosphosilica glass (BPSG), plasma-enhanced tetraethylorthosilicate (PETEOS), fluorosilicate glass (FSG), carbon-doped silicon oxide (CDO), a xerogel, an aerogel, amorphous fluorinated carbon, organosilicate glass (OSG), parylene, bis-benzocyclobutene (BCB), SiLK, polyimide, a porous polymeric material, or a combination thereof.

An electric field may be applied to the electrostrictive layer 250 according to a voltage applied to the gate structure 240, and thus, the electrostrictive layer 250 may be deformed. When the electrostrictive layer 250 is deformed, stress applied to the tunable band-gap layer 230 is changed, and the band gap of the tunable band-gap layer 230 may vary according to the stress.

For example, when an ON-voltage is applied to the gate structure 240, the electrostrictive layer 250 may expand. When the electrostrictive layer 250 expands, stress is applied to the tunable band-gap layer 230, and the band gap of the tunable band-gap layer 230 may decrease according to the stress. Accordingly, an Ohmic junction may be formed between the first source/drain 221, which includes the metal, and the tunable band-gap layer 230. Thus, contact resistance between the first source/drain 221 and the tunable band-gap layer 230 when the ON-voltage is applied to the gate structure 240 may be less than the contact resistance between the first source/drain 221 and the tunable band-gap layer 230 when an OFF-voltage is applied to the gate structure 240. Therefore, the semiconductor device 200 according to an embodiment of the inventive concept may have a high ratio of an ON-current to an OFF-current. For example, the ratio of the ON-current to the OFF-current of the semiconductor device 200 according to an embodiment of the inventive concept may be increased by as much as about 500%, as compared with a ratio of an ON-current to an OFF-current of a general MOSFET.

In addition, when the OFF-voltage is applied to the gate structure 240, the electrostrictive layer 250 may not be deformed. When the electrostrictive layer 250 is not deformed, stress may not be applied to the tunable band-gap layer 230. Accordingly, the band gap of the tunable band-gap layer 230 when the OFF-voltage is applied to the gate structure 240 may be greater than the band gap of the tunable band-gap layer 230 when the ON-voltage is applied to the gate structure 240. Therefore, the generation of electron-hole pairs may be reduced due to the increased band gap, and thus, the GIDL may be reduced. For example, the GIDL of the semiconductor device 200 according to an embodiment of the inventive concept may be reduced by as much as about 30%, as compared with the GIDL of a general MOSFET.

Figure 6:
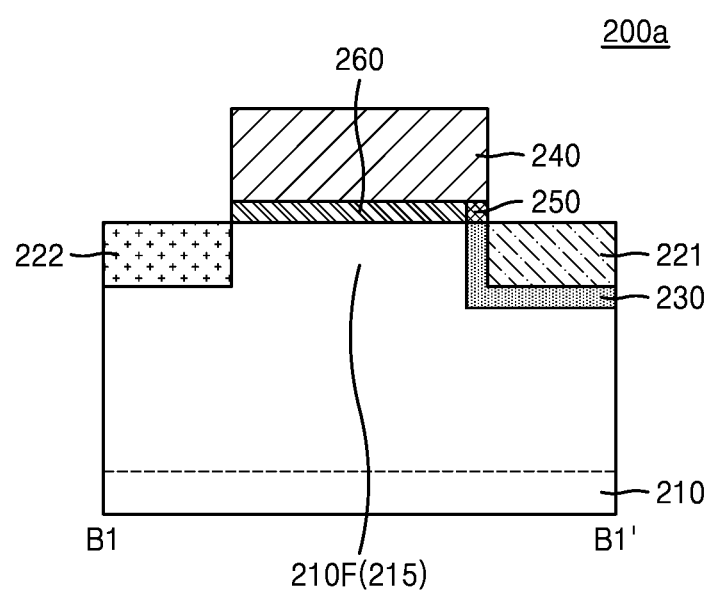
FIG. 6 is a cross-sectional view illustrating a semiconductor device according to an embodiment of the inventive concept.

FIG. 6 is a cross-sectional view illustrating a semiconductor device 200a according to an embodiment of the inventive concept. Hereinafter, differences between the semiconductor device 200 shown in FIGS. 5A to 5C and the semiconductor device 200a shown in FIG. 6 will be described.

Referring to FIG. 6, the semiconductor device 200a may further include a gate dielectric layer 260 between the gate structure 240 and the channel 215. The gate dielectric layer 260 may be arranged between the gate structure 240 and the fin structure 210F of the substrate 210 (e.g., on top and side surfaces of the fin structure 210F) and may contact the electrostrictive layer 250. The gate dielectric layer 260 may include or be formed of silicon oxide, silicon nitride, a high-k material, or a combination thereof.

Figure 7:
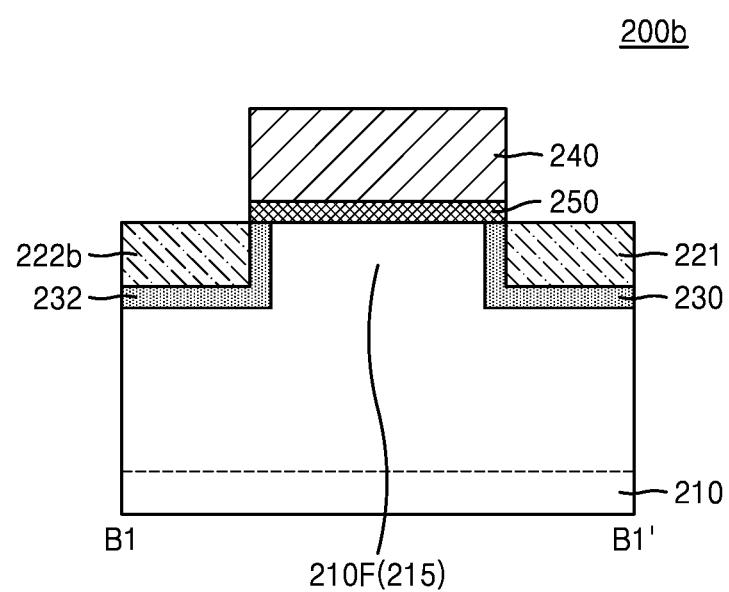
FIG. 7 is a cross-sectional view illustrating a semiconductor device according to an embodiment of the inventive concept.

FIG. 7 is a cross-sectional view illustrating a semiconductor device 200b according to an embodiment of the inventive concept. Hereinafter, differences between the semiconductor device 200 shown in FIGS. 5A to 5C and the semiconductor device 200b shown in FIG. 7 will be described.

Referring to FIG. 7, a second source/drain 222b may include or be formed of a metal. For example, the second source/drain 222b may include or may be tungsten (W), aluminum (Al), or a combination thereof.

In addition, the semiconductor device 200b may further include an additional tunable band-gap layer 232 between the second source/drain 222b and the channel 215. The additional tunable band-gap layer 232 may be arranged between the fin structure 210F of the substrate 210 and the second source/drain 222b. The additional tunable band-gap layer 232 may have a band gap varying according to stress. For example, the additional tunable band-gap layer 232 may include a 2-dimensional material. The additional tunable band-gap layer 232 may include or be formed of, for example, a TMD. For example, the additional tunable band-gap layer 232 may include or be formed of $MX_2$, wherein M is a transition metal such as molybdenum (Mo), tungsten (W), or tin (Sn), and X is a chalcogen element such as sulfur (S), selenium (Se), or tellurium (Te). The additional tunable band-gap layer 232 may include or be formed of a multi-layered 2-dimensional material. For example, the additional tunable band-gap layer 232 may be a plurality of 2-dimensional material atomic layers, which are stacked on each other.

The electrostrictive layer 250 may further extend between the gate structure 240 and the additional tunable band-gap layer 232.

An electric field may be applied to the electrostrictive layer 250 according to the voltage applied to the gate structure 240, and thus, the electrostrictive layer 250 may be deformed. When the electrostrictive layer 250 is deformed, stress applied to each of the tunable band-gap layer 230 and the additional tunable band-gap layer 232 is changed, and band gaps of the tunable band-gap layer 230 and the additional tunable band-gap layer 232 may respectively vary according to the stress.

For example, when an ON-voltage is applied to the gate structure 240, the electrostrictive layer 250 may expand. When the electrostrictive layer 250 expands, stress is applied to each of the tunable band-gap layer 230 and the additional tunable band-gap layer 232, and the respective band gaps of the tunable band-gap layer 230 and the additional tunable band-gap layer 232 may decrease according to the stress. Accordingly, an Ohmic junction may be formed between the first source/drain 221, which includes the metal, and the tunable band-gap layer 230. In addition, an Ohmic junction may be formed between the second source/drain 222b, which includes a metal, and the additional tunable band-gap layer 232. Thus, the contact resistance between the first source/drain 221 and the tunable band-gap layer 230 when the ON-voltage is applied to the gate structure 240 may be less than the contact resistance between the first source/drain 221 and the tunable band-gap layer 230 when the OFF-voltage is applied to the gate structure 240. In addition, contact resistance between the second source/drain 222b and the additional tunable band-gap layer 232 when the ON-voltage is applied to the gate structure 240 may be less than the contact resistance between the second source/drain 222b and the additional tunable band-gap layer 232 when the OFF-voltage is applied to the gate structure 240. Therefore, the semiconductor device 200b according to an embodiment of the inventive concept may have a high ratio of an ON-current to an OFF-current.

In addition, when the OFF-voltage is applied to the gate structure 240, the electrostrictive layer 250 may not be deformed. When the electrostrictive layer 250 is not deformed, stress may not be applied to each of the tunable band-gap layer 230 and the additional tunable band-gap layer 232. Accordingly, the band gap of the tunable band-gap layer 230 when the OFF-voltage is applied to the gate structure 240 may be greater than the band gap of the tunable band-gap layer 230 when the ON-voltage is applied to the gate structure 240. In addition, the band gap of the additional tunable band-gap layer 232 when the OFF-voltage is applied to the gate structure 240 may be greater than the band gap of the additional tunable band-gap layer 232 when the ON-voltage is applied to the gate structure 240. Therefore, the generation of electron-hole pairs may be reduced due to the increased band gap, and thus, the GIDL may be reduced.

Figure 8:
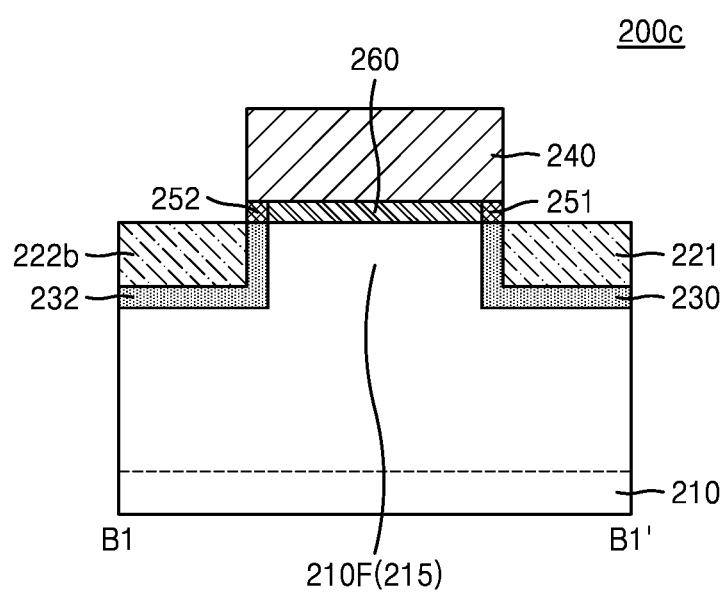
FIG. 8 is a cross-sectional view illustrating a semiconductor device according to an embodiment of the inventive concept.

FIG. 8 is a cross-sectional view illustrating a semiconductor device 200c according to an embodiment of the inventive concept. Hereinafter, differences between the semiconductor device 200b shown in FIG. 7 and the semiconductor device 200c shown in FIG. 8 will be described.

Referring to FIG. 8, the semiconductor device 200c may include a first electrostrictive layer 251 and a second electrostrictive layer 252, instead of the electrostrictive layer 250 shown in FIG. 7. The first electrostrictive layer 251 may be arranged between the gate structure 240 and the tunable band-gap layer 230. The second electrostrictive layer 252 may be arranged between the gate structure 240 and the additional tunable band-gap layer 232. The first electrostrictive layer 251 and the second electrostrictive layer 252 may be deformed according to an electric field. The first electrostrictive layer 251 and the second electrostrictive layer 252 may each include or be formed of, for example, lead magnesium niobate (PMN), lead magnesium niobate-lead titanate (PMN-PT), lead lanthanum zirconate titanate (PLZT), titanate, alkaline niobate, or bismuth perovskite.

The first electrostrictive layer 251 and the second electrostrictive layer 252 may each include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The semiconductor device 200c may further include the gate dielectric layer 260 between the first electrostrictive layer 251 and the second electrostrictive layer 252. The gate dielectric layer 260 may be arranged between the channel 215 and the gate structure 240. For example, the gate dielectric layer 260 may be arranged between the fin structure 210F of the substrate 210 and the gate structure 240 (e.g., on top and side surfaces of the fin structure 210F). The gate dielectric layer 260 may include or be formed of silicon oxide, silicon nitride, a high-k material, or a combination thereof.

An electric field may be applied to the first electrostrictive layer 251 and the second electrostrictive layer 252 according to the voltage applied to the gate structure 240, and thus, the first electrostrictive layer 251 and the second electrostrictive layer 252 may be deformed. When the first electrostrictive layer 251 and the second electrostrictive layer 252 are deformed, the stress applied to each of the tunable band-gap layer 230 and the additional tunable band-gap layer 232 is changed, and the band gaps of the tunable band-gap layer 230 and the additional tunable band-gap layer 232 may respectively vary according to the stress.

For example, when the ON-voltage is applied to the gate structure 240, the first electrostrictive layer 251 and the second electrostrictive layer 252 may expand. When the first electrostrictive layer 251 and the second electrostrictive layer 252 expand, stress is applied to each of the tunable band-gap layer 230 and the additional tunable band-gap layer 232, and the respective band gaps of the tunable band-gap layer 230 and the additional tunable band-gap layer 232 may decrease according to the stress. Accordingly, an Ohmic junction may be formed between the first source/drain 221, which includes the metal, and the tunable band-gap layer 230. In addition, an Ohmic junction may be formed between the second source/drain 222b, which includes the metal, and the additional tunable band-gap layer 232. Thus, the contact resistance between the first source/drain 221 and the tunable band-gap layer 230 when the ON-voltage is applied to the gate structure 240 may be less than the contact resistance between the first source/drain 221 and the tunable band-gap layer 230 when the OFF-voltage is applied to the gate structure 240. In addition, contact resistance between the second source/drain 222b and the additional tunable band-gap layer 232 when the ON-voltage is applied to the gate structure 240 may be less than the contact resistance between the second source/drain 222b and the additional tunable band-gap layer 232 when the OFF-voltage is applied to the gate structure 240. Therefore, the semiconductor device 200c according to an embodiment of the inventive concept may have a high ratio of an ON-current to an OFF-current.

In addition, when the OFF-voltage is applied to the gate structure 240, the first electrostrictive layer 251 and the second electrostrictive layer 252 may not be deformed. When the first electrostrictive layer 251 and the second electrostrictive layer 252 are not deformed, the stress may not be applied to each of the tunable band-gap layer 230 and the additional tunable band-gap layer 232. Accordingly, the band gap of the tunable band-gap layer 230 when the OFF-voltage is applied to the gate structure 240 may be greater than the band gap of the tunable band-gap layer 230 when the ON-voltage is applied to the gate structure 240. In addition, the band gap of the additional tunable band-gap layer 232 when the OFF-voltage is applied to the gate structure 240 may be greater than the band gap of the additional tunable band-gap layer 232 when the ON-voltage is applied to the gate structure 240. Therefore, the generation of electron-hole pairs may be reduced due to the increased band gap, and thus, the GIDL may be reduced.

Figure 9:
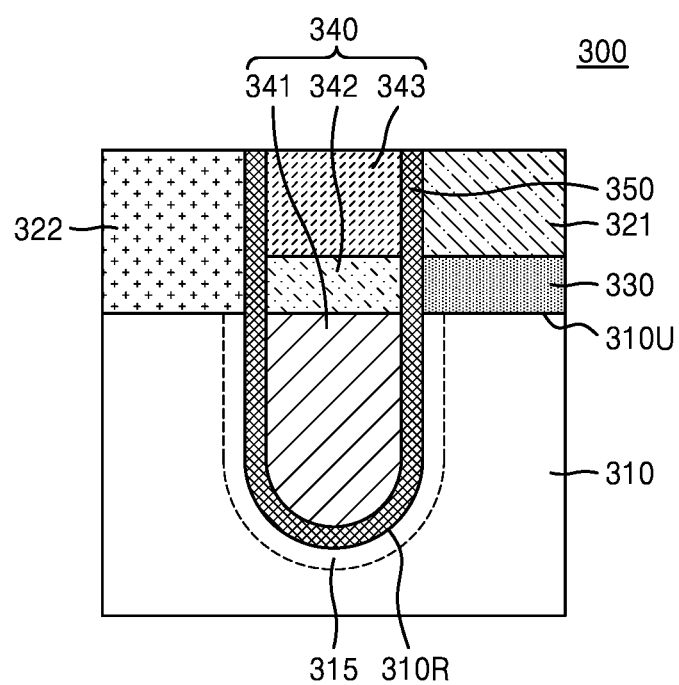
FIG. 9 is a cross-sectional view illustrating a semiconductor device according to an embodiment of the inventive concept.

FIG. 9 is a cross-sectional view illustrating a semiconductor device 300 according to an embodiment of the inventive concept.

Referring to FIG. 9, the semiconductor device 300 may include a channel 315, a gate structure 340, a first source/drain 321, a tunable band-gap layer 330, an electrostrictive layer 350, and a second source/drain 322.

A substrate 310 may have a main surface 310U. The substrate 310 may have a recess 310R recessed from the main surface 310U of the substrate 310. The recess 310R may be formed by etching the substrate 310. The channel 315 may include a portion around the recess 310R of the substrate 310. The substrate 310 may include or be formed of a semiconductor material.

The gate structure 340 may be arranged over the channel 315. The gate structure 340 may be arranged in the recess 310R of the substrate 310. In some embodiments, the gate structure 340 may include a metal layer 341, a polysilicon layer 342, and a gate capping layer 343, which are sequentially stacked on the recess 310R of the substrate 310 in the stated order. The metal layer 341 may include or be formed of a metal, a metal silicide, or a combination thereof. The metal layer 341 may include or may be, for example, tungsten (W), titanium (Ti), cobalt (Co), tungsten silicide, titanium silicide, cobalt silicide, or a combination thereof. The polysilicon layer 342 may include or be formed of polysilicon. The gate capping layer 343 may include or be formed of an insulating material such as silicon nitride.

The first source/drain 321 may be arranged at one end of the channel 315. The first source/drain 321 may be arranged on the substrate 310 at one side of the gate structure 340. The first source/drain 321 may include or be formed of a metal. For example, the first source/drain 321 may include or may be tungsten (W), aluminum (Al), or a combination thereof.

The tunable band-gap layer 330 may be arranged between the channel 315 and the first source/drain 321. The tunable band-gap layer 330 may be arranged between the substrate 310 and the first source/drain 321. The tunable band-gap layer 330 may have a band gap varying according to stress. For example, the tunable band-gap layer 330 may include or be formed of a 2-dimensional material. The tunable band-gap layer 330 may include or be formed of, for example, a TMD. For example, the tunable band-gap layer 330 may include or be formed of $MX_2$, wherein M is a transition metal such as molybdenum (Mo), tungsten (W), or tin (Sn), and X is a chalcogen element such as sulfur (S), selenium (Se), or tellurium (Te). The tunable band-gap layer 330 may include or be formed of a multi-layered 2-dimensional material. For example, the tunable band-gap layer 330 may be a plurality of 2-dimensional material atomic layers, which are stacked on each other.

The electrostrictive layer 350 may be arranged between the tunable band-gap layer 330 and the gate structure 340. In some embodiments, the electrostrictive layer 350 may extend between the channel 315 and the gate structure 340. For example, in some embodiments, the electrostrictive layer 350 may extend between the substrate 310 and the gate structure 340. In some embodiments, the electrostrictive layer 350 may further extend between the first source/drain 321 and the gate structure 340. In some embodiments, the electrostrictive layer 350 may further extend between the second source/drain 322 and the gate structure 340. The electrostrictive layer 350 may function as a dielectric layer, and may be described as a dielectric layer. The electrostrictive layer 350 may be deformed according to an electric field. The electrostrictive layer 350 may include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The electrostrictive layer 350 may include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The second source/drain 322 may be arranged at the other end of the channel 315. The second source/drain 322 may be arranged on the substrate 310 at the other side of the gate structure 340. The second source/drain 322 may include or be formed of a doped semiconductor material.

An electric field may be applied to the electrostrictive layer 350 according to a voltage applied to the gate structure 340, and thus, the electrostrictive layer 350 may be deformed. When the electrostrictive layer 350 is deformed, stress applied to the tunable band-gap layer 330 is changed, and the band gap of the tunable band-gap layer 330 may vary according to the stress.

For example, when an ON-voltage is applied to the gate structure 340, the electrostrictive layer 350 may expand. When the electrostrictive layer 350 expands, stress is applied to the tunable band-gap layer 330, and the band gap of the tunable band-gap layer 330 may decrease according to the stress. Accordingly, an Ohmic junction may be formed between the first source/drain 321, which includes the metal, and the tunable band-gap layer 330. Thus, contact resistance between the first source/drain 321 and the tunable band-gap layer 330 when the ON-voltage is applied to the gate structure 340 may be less than the contact resistance between the first source/drain 321 and the tunable band-gap layer 330 when an OFF-voltage is applied to the gate structure 340. Therefore, the semiconductor device 300 according to an embodiment of the inventive concept may have a high ratio of an ON-current to an OFF-current. For example, the ratio of the ON-current to the OFF-current of the semiconductor device 300 according to an embodiment of the inventive concept may be increased by as much as about 500%, as compared with a ratio of an ON-current to an OFF-current of a general MOSFET.

In addition, when the OFF-voltage is applied to the gate structure 340, the electrostrictive layer 350 may not be deformed. When the electrostrictive layer 350 is not deformed, stress may not be applied to the tunable band-gap layer 330. Accordingly, the band gap of the tunable band-gap layer 330 when the OFF-voltage is applied to the gate structure 340 may be greater than the band gap of the tunable band-gap layer 330 when the ON-voltage is applied to the gate structure 340. Therefore, the generation of electron-hole pairs may be reduced due to the increased band gap, and thus, the GIDL may be reduced. For example, the GIDL of the semiconductor device 300 according to an embodiment of the inventive concept may be reduced by as much as about 30%, as compared with the GIDL of a general MOSFET.

Figure 10:
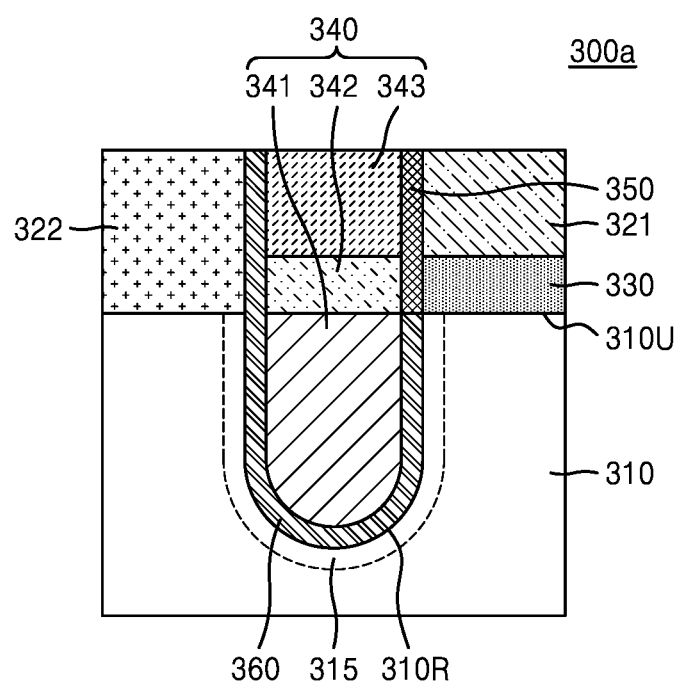
FIG. 10 is a cross-sectional view illustrating a semiconductor device according to an embodiment of the inventive concept.

FIG. 10 is a cross-sectional view illustrating a semiconductor device 300a according to an embodiment of the inventive concept. Hereinafter, differences between the semiconductor device 300 shown in FIG. 9 and the semiconductor device 300a shown in FIG. 10 will be described.

Referring to FIG. 10, the semiconductor device 300a may further include a gate dielectric layer 360 between the gate structure 340 and the channel 315, the gate dielectric layer 360 being separate from and formed of a different material from the electrostrictive layer 350. The gate dielectric layer 360 may be arranged between the gate structure 340 and the substrate 310 and may contact the electrostrictive layer 350. In some embodiments, the gate dielectric layer 360 may further extend between the gate structure 340 and the second source/drain 322. The gate dielectric layer 360 may include or be formed of silicon oxide, silicon nitride, a high-k material, or a combination thereof.

Figure 11:
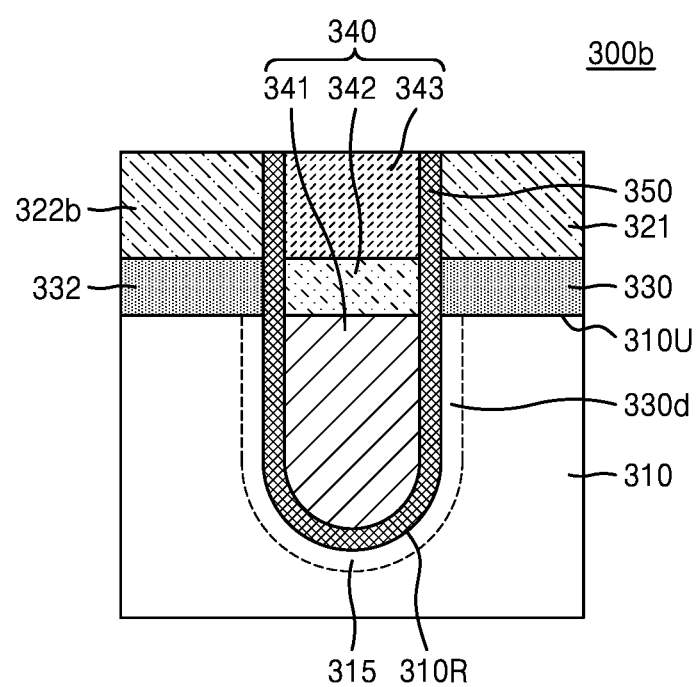
FIG. 11 is a cross-sectional view illustrating a semiconductor device according to an embodiment of the inventive concept.

FIG. 11 is a cross-sectional view illustrating a semiconductor device 300b according to an embodiment of the inventive concept. Hereinafter, differences between the semiconductor device 300 shown in FIG. 9 and the semiconductor device 300b shown in FIG. 11 will be described.

Referring to FIG. 11, a second source/drain 322b may include or be formed of a metal. For example, the second source/drain 322b may include or may be formed of tungsten (W), aluminum (Al), or a combination thereof.

In addition, the semiconductor device 300b may further include an additional tunable band-gap layer 332 between the second source/drain 322b and the channel 315. The additional tunable band-gap layer 332 may be arranged between the substrate 310 and the second source/drain 322b. The additional tunable band-gap layer 332 may have a band gap varying according to stress. For example, the additional tunable band-gap layer 332 may include or be formed of a 2-dimensional material. The additional tunable band-gap layer 332 may include or be formed of, for example, a TMD. For example, the additional tunable band-gap layer 332 may include or be formed of $MX_2$, wherein M is a transition metal such as molybdenum (Mo), tungsten (W), or tin (Sn), and X is a chalcogen element such as sulfur (S), selenium (Se), or tellurium (Te). The additional tunable band-gap layer 332 may include or be formed of a multi-layered 2-dimensional material. For example, the additional tunable band-gap layer 332 may be a plurality of 2-dimensional material atomic layers, which are stacked on each other.

The electrostrictive layer 350 may further extend between the gate structure 340 and the additional tunable band-gap layer 332.

An electric field may be applied to the electrostrictive layer 350 according to the voltage applied to the gate structure 340, and thus, the electrostrictive layer 350 may be deformed. When the electrostrictive layer 350 is deformed, stress applied to each of the tunable band-gap layer 330 and the additional tunable band-gap layer 332 is changed, and band gaps of the tunable band-gap layer 330 and the additional tunable band-gap layer 332 may respectively vary according to the stress.

For example, when the ON-voltage is applied to the gate structure 340, the electrostrictive layer 350 may expand. When the electrostrictive layer 350 expands, stress is applied to each of the tunable band-gap layer 330 and the additional tunable band-gap layer 332, and the respective band gaps of the tunable band-gap layer 330 and the additional tunable band-gap layer 332 may decrease according to the stress. Accordingly, an Ohmic junction may be formed between the first source/drain 321, which includes the metal, and the tunable band-gap layer 330. In addition, an Ohmic junction may be formed between the second source/drain 322b, which includes the metal, and the additional tunable band-gap layer 332. Thus, the contact resistance between the first source/drain 321 and the tunable band-gap layer 330 when the ON-voltage is applied to the gate structure 340 may be less than the contact resistance between the first source/drain 321 and the tunable band-gap layer 330 when the OFF-voltage is applied to the gate structure 340. In addition, contact resistance between the second source/drain 322b and the additional tunable band-gap layer 332 when the ON-voltage is applied to the gate structure 340 may be less than the contact resistance between the second source/drain 322b and the additional tunable band-gap layer 332 when the OFF-voltage is applied to the gate structure 340. Therefore, the semiconductor device 300b according to an embodiment of the inventive concept may have a high ratio of an ON-current to an OFF-current.

In addition, when the OFF-voltage is applied to the gate structure 340, the electrostrictive layer 350 may not be deformed. When the electrostrictive layer 350 is not deformed, stress may not be applied to each of the tunable band-gap layer 330 and the additional tunable band-gap layer 332. Accordingly, the band gap of the tunable band-gap layer 330 when the OFF-voltage is applied to the gate structure 340 may be greater than the band gap of the tunable band-gap layer 330 when the ON-voltage is applied to the gate structure 340. In addition, the band gap of the additional tunable band-gap layer 332 when the OFF-voltage is applied to the gate structure 340 may be greater than the band gap of the additional tunable band-gap layer 332 when the ON-voltage is applied to the gate structure 340. Therefore, the generation of electron-hole pairs may be reduced due to the increased band gap, and thus, the GIDL may be reduced.

Figure 12:
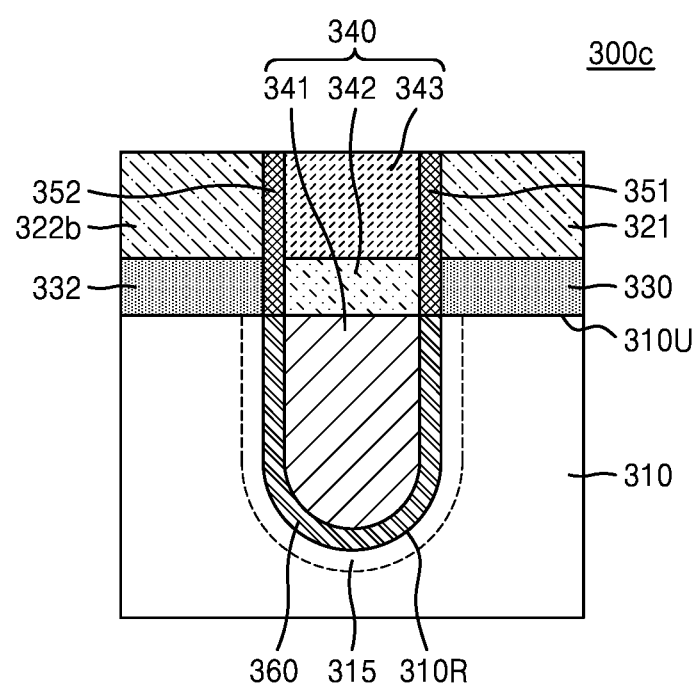
FIG. 12 is a cross-sectional view illustrating a semiconductor device according to an embodiment of the inventive concept.

FIG. 12 is a cross-sectional view illustrating a semiconductor device 300c according to an embodiment of the inventive concept. Hereinafter, differences between the semiconductor device 300b shown in FIG. 11 and the semiconductor device 300c shown in FIG. 12 will be described.

Referring to FIG. 12, the semiconductor device 300c may include a first electrostrictive layer 351 and a second electrostrictive layer 352, instead of the electrostrictive layer 350 shown in FIG. 11. The first electrostrictive layer 351 may be arranged between the gate structure 340 and the tunable band-gap layer 330. The second electrostrictive layer 352 may be arranged between the gate structure 340 and the additional tunable band-gap layer 332. In some embodiments, the first electrostrictive layer 351 may further extend between the gate structure 340 and the first source/drain 321. In some embodiments, the second electrostrictive layer 352 may further extend between the gate structure 340 and the second source/drain 322b. The first electrostrictive layer 351 and the second electrostrictive layer 352 may be deformed according to an electric field. The first electrostrictive layer 351 and the second electrostrictive layer 352 may each include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The first electrostrictive layer 351 and the second electrostrictive layer 352 may each include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The semiconductor device 300c may further include the gate dielectric layer 360. The gate dielectric layer 360 may be arranged between the channel 315 and the gate structure 340. For example, the gate dielectric layer 360 may be arranged between the substrate 310 and the gate structure 340. The gate dielectric layer 360 may include or be formed of silicon oxide, silicon nitride, a high-k material, or a combination thereof.

An electric field may be applied to the first electrostrictive layer 351 and the second electrostrictive layer 352 according to the voltage applied to the gate structure 340, and thus, the first electrostrictive layer 351 and the second electrostrictive layer 352 may be deformed. When the first electrostrictive layer 351 and the second electrostrictive layer 352 are deformed, the stress applied to each of the tunable band-gap layer 330 and the additional tunable band-gap layer 332 is changed, and the band gaps of the tunable band-gap layer 330 and the additional tunable band-gap layer 332 may respectively vary according to the stress.

For example, when the ON-voltage is applied to the gate structure 340, the first electrostrictive layer 351 and the second electrostrictive layer 352 may expand. When the first electrostrictive layer 351 and the second electrostrictive layer 352 expand, stress is applied to each of the tunable band-gap layer 330 and the additional tunable band-gap layer 332, and the respective band gaps of the tunable band-gap layer 330 and the additional tunable band-gap layer 332 may decrease according to the stress. Accordingly, an Ohmic junction may be formed between the first source/drain 321, which includes the metal, and the tunable band-gap layer 330. In addition, an Ohmic junction may be formed between the second source/drain 322b, which includes the metal, and the additional tunable band-gap layer 332. Thus, the contact resistance between the first source/drain 321 and the tunable band-gap layer 330 when the ON-voltage is applied to the gate structure 340 may be less than the contact resistance between the first source/drain 321 and the tunable band-gap layer 330 when the OFF-voltage is applied to the gate structure 340. In addition, the contact resistance between the second source/drain 322b and the additional tunable band-gap layer 332 when the ON-voltage is applied to the gate structure 340 may be less than the contact resistance between the second source/drain 322b and the additional tunable band-gap layer 332 when the OFF-voltage is applied to the gate structure 340. Therefore, the semiconductor device 300c according to an embodiment of the inventive concept may have a high ratio of an ON-current to an OFF-current.

In addition, when the OFF-voltage is applied to the gate structure 340, the first electrostrictive layer 351 and the second electrostrictive layer 352 may not be deformed. When the first electrostrictive layer 351 and the second electrostrictive layer 352 are not deformed, the stress may not be applied to each of the tunable band-gap layer 330 and the additional tunable band-gap layer 332. Accordingly, the band gap of the tunable band-gap layer 330 when the OFF-voltage is applied to the gate structure 340 may be greater than the band gap of the tunable band-gap layer 330 when the ON-voltage is applied to the gate structure 340. In addition, the band gap of the additional tunable band-gap layer 332 when the OFF-voltage is applied to the gate structure 340 may be greater than the band gap of the additional tunable band-gap layer 332 when the ON-voltage is applied to the gate structure 340. Therefore, the generation of electron-hole pairs may be reduced due to the increased band gap, and thus, the GIDL may be reduced.

Figure 13:
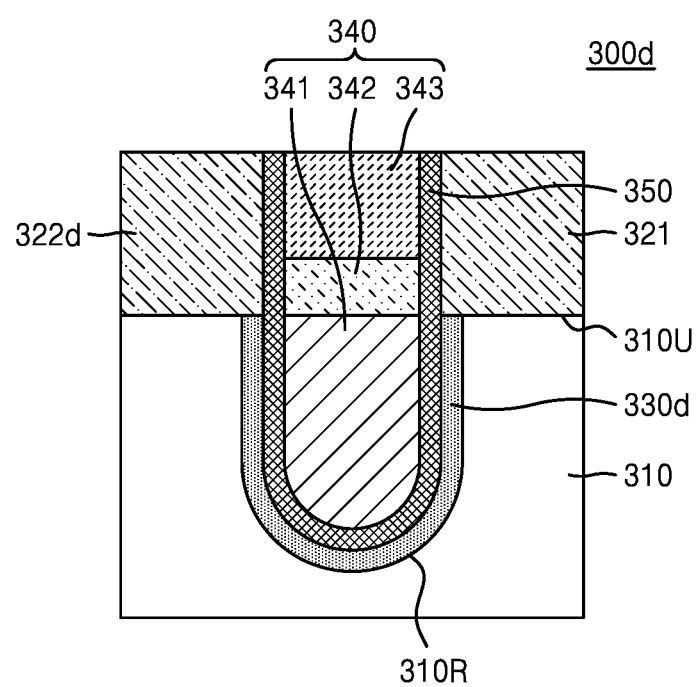
FIG. 13 is a cross-sectional view illustrating a semiconductor device according to an embodiment of the inventive concept.

FIG. 13 is a cross-sectional view illustrating a semiconductor device 300d according to an embodiment of the inventive concept.

Referring to FIG. 13, the semiconductor device 300d may include the substrate 310, the gate structure 340, a tunable band-gap layer 330d, the electrostrictive layer 350, the first source/drain 321, and a second source/drain 322d.

The substrate 310 may have the main surface 310U. The substrate 310 may have the recess 310R recessed from the main surface 310U of the substrate 310. The recess 310R may be formed by etching the substrate 310. The substrate 310 may include a semiconductor material.

The gate structure 340 may be arranged in the recess 310R of the substrate 310. In some embodiments, the gate structure 340 may include the metal layer 341, the polysilicon layer 342, and the gate capping layer 343, which are sequentially stacked on the recess 310R of the substrate 310 in the stated order. The metal layer 341 may include or be formed of a metal, a metal silicide, or a combination thereof. The metal layer 341 may include or may be, for example, tungsten (W), titanium (Ti), cobalt (Co), tungsten silicide, titanium silicide, cobalt silicide, or a combination thereof. The polysilicon layer 342 may include or be formed of polysilicon. The gate capping layer 343 may include or be formed of an insulating material such as silicon nitride.

The tunable band-gap layer 330d may function as the channel 315. The tunable band-gap layer 330d may be arranged on the recess 310R of the substrate 310. The tunable band-gap layer 330d may have a band gap varying according to stress. For example, the tunable band-gap layer 330d may include or be formed of a 2-dimensional material. The tunable band-gap layer 330d may include or be formed of, for example, a TMD. For example, the tunable band-gap layer 330d may include or be formed of $MX_2$, wherein M is a transition metal such as molybdenum (Mo), tungsten (W), or tin (Sn), and X is a chalcogen element such as sulfur (S), selenium (Se), or tellurium (Te). The tunable band-gap layer 330d may include or be formed of a multi-layered 2-dimensional material. For example, the tunable band-gap layer 330d may be a plurality of 2-dimensional material atomic layers, which are stacked on each other.

The electrostrictive layer 350 may be arranged between the tunable band-gap layer 330d and the gate structure 340, and may function as a dielectric layer. In some embodiments, as depicted in FIG. 13, the electrostrictive layer 350 may further extend between the first source/drain 321 and the gate structure 340. In some embodiments, the electrostrictive layer 350 may further extend between the second source/drain 322d and the gate structure 340. The electrostrictive layer 350 may be deformed according to an electric field. The electrostrictive layer 350 may include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The electrostrictive layer 350 may include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The first source/drain 321 may be arranged at one end of the tunable band-gap layer 330d. The first source/drain 321 may be arranged on the substrate 310 at one side of the gate structure 340. The first source/drain 321 may include or be formed of a metal. For example, the first source/drain 321 may be tungsten (W), aluminum (Al), or a combination thereof.

The second source/drain 322d may be arranged at the other end of the tunable band-gap layer 330d. The second source/drain 322d may be arranged on the substrate 310 at the other side of the gate structure 340. The second source/drain 322d may include or be formed of a metal. For example, the second source/drain 322d may be tungsten (W), aluminum (Al), or a combination thereof.

An electric field may be applied to the electrostrictive layer 350 according to the voltage applied to the gate structure 340, and thus, the electrostrictive layer 350 may be deformed. When the electrostrictive layer 350 is deformed, stress applied to the tunable band-gap layer 330d is changed, and the band gap of the tunable band-gap layer 330d may vary according to the stress. The semiconductor device 300d according to an embodiment of the inventive concept may have a subthreshold swing (SS) that is less than 60 mV/decade.

Figure 14A:
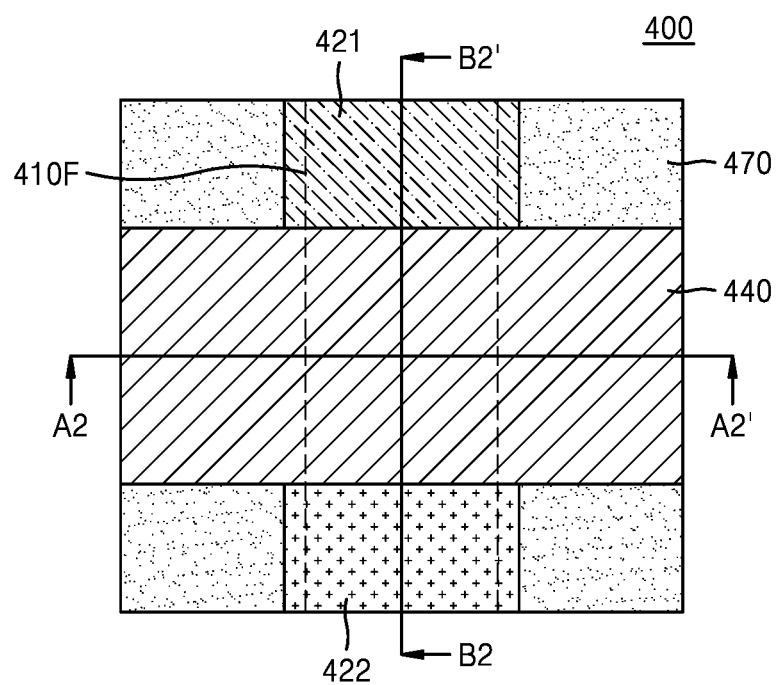
FIG. 14A is a plan view illustrating a semiconductor device according to an embodiment of the inventive concept.
Figure 14B:
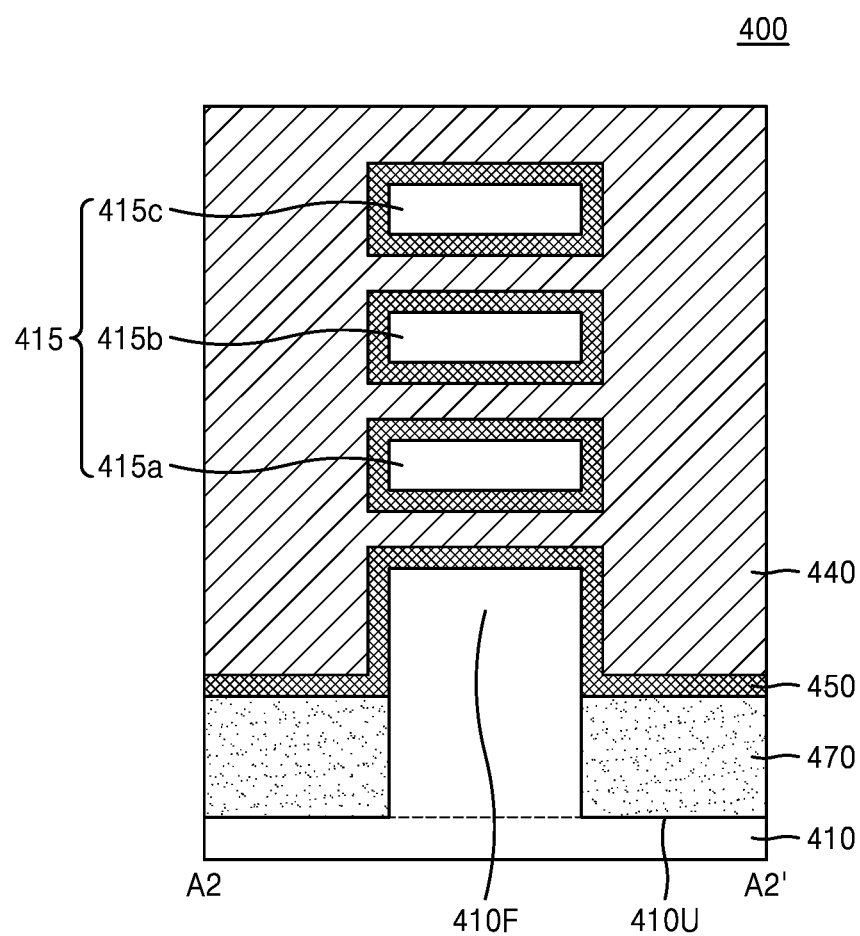
FIG. 14B is a cross-sectional view illustrating a semiconductor device according to an embodiment of the inventive concept, taken along a line A2-A2' of FIG. 14A.
Figure 14C:
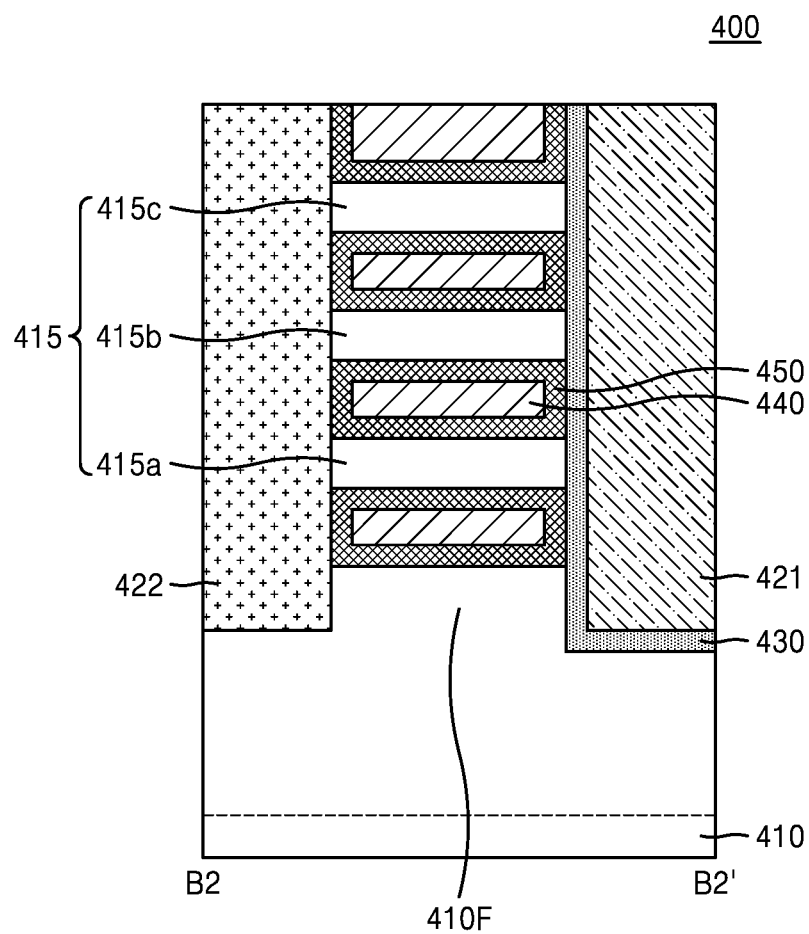
FIG. 14C is a cross-sectional view illustrating a semiconductor device according to an embodiment of the inventive concept, taken along a line B2-B2' of FIG. 14A.

FIG. 14A is a plan view illustrating a semiconductor device 400 according to an embodiment of the inventive concept. FIG. 14B is a cross-sectional view illustrating the semiconductor device 400 according to an embodiment of the inventive concept, taken along a line A2-A2' of FIG. 14A. FIG. 14C is a cross-sectional view illustrating the semiconductor device 400 according to an embodiment of the inventive concept, taken along a line B2-B2' of FIG. 14A.

Referring to FIGS. 14A to 14C, the semiconductor device 400 may include a channel 415, a gate structure 440, a first source/drain 421, a tunable band-gap layer 430, an electrostrictive layer 450, a second source/drain 422, and a device isolation layer 470.

A substrate 410 may have a main surface 410U. The substrate 410 may have a fin structure 410F protruding from the main surface 410U of the substrate 410. The fin structure 410F may be formed by etching the substrate 410 or formed by epitaxial growth on the substrate 410. The channel 415 may include a plurality of portions 415a to 415c, which are apart from the fin structure 410F and apart from each other. Although the channel 415 is shown in FIGS. 14B and 14C as including the three portions 415a to 415c apart from each other, the number of portions, which are apart from each other and included in the channel 415, is not limited to 3. The substrate 410 may include or be formed of a semiconductor material.

The gate structure 440 may surround the channel 415. As shown in FIG. 14A, an extension direction of the gate structure 440 may intersect with an extension direction of the fin structure 410F. The gate structure 440 may include or be formed of polysilicon, a metal, a metal silicide, or a combination thereof. For example, the gate structure 440 may include or be formed of polysilicon, tungsten (W), titanium (Ti), cobalt (Co), tungsten silicide, titanium silicide, cobalt silicide, or a combination thereof.

The first source/drain 421 may be arranged at one end of the channel 415. The first source/drain 421 may be arranged on the fin structure 410F of the substrate 410 at one side of the gate structure 440. The first source/drain 421 may include or be formed of a metal. For example, the first source/drain 421 may be tungsten (W), aluminum (Al), or a combination thereof.

The tunable band-gap layer 430 may be arranged between the channel 415 and the first source/drain 421. The tunable band-gap layer 430 may further extend between the gate structure 440 and the first source/drain 421. The tunable band-gap layer 430 may further extend between the fin structure 410F of the substrate 410 and the first source/drain 421. The tunable band-gap layer 430 may have a band gap varying according to stress. For example, the tunable band-gap layer 430 may include or be formed of a 2-dimensional material. The tunable band-gap layer 430 may include or be formed of, for example, a TMD. For example, the tunable band-gap layer 430 may include or be formed of $MX_2$, wherein M is a transition metal such as molybdenum (Mo), tungsten (W), or tin (Sn), and X is a chalcogen element such as sulfur (S), selenium (Se), or tellurium (Te). The tunable band-gap layer 430 may include or be formed of a multi-layered 2-dimensional material. For example, the tunable band-gap layer 430 may be a plurality of 2-dimensional material atomic layers, which are stacked on each other.

The electrostrictive layer 450 may be arranged between the tunable band-gap layer 430 and the gate structure 440. In some embodiments, the electrostrictive layer 450 may further extend between the channel 415 and the gate structure 440. In some embodiments, the electrostrictive layer 450 may further extend between the second source/drain 422 and the gate structure 440. The electrostrictive layer 450 may be deformed according to an electric field. The electrostrictive layer 450 may include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The electrostrictive layer 450 may include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The second source/drain 422 may be arranged at the other end of the channel 415. The second source/drain 422 may be arranged on the substrate 410 at the other side of the gate structure 440. The second source/drain 422 may include or may be a doped semiconductor material.

The device isolation layer 470 may be arranged on the main surface 410U of the substrate 410. The fin structure 410F of the substrate 410 may protrude from the device isolation layer 470. The device isolation layer 470 may include or may be formed of silicon oxide, silicon nitride, a low-k material, or a combination thereof.

An electric field may be applied to the electrostrictive layer 450 according to a voltage applied to the gate structure 440, and thus, the electrostrictive layer 450 may be deformed. When the electrostrictive layer 450 is deformed, stress applied to the tunable band-gap layer 430 is changed, and the band gap of the tunable band-gap layer 430 may vary according to the stress.

For example, when an ON-voltage is applied to the gate structure 440, the electrostrictive layer 450 may expand. When the electrostrictive layer 450 expands, stress is applied to the tunable band-gap layer 430, and the band gap of the tunable band-gap layer 430 may decrease according to the stress. Accordingly, an Ohmic junction may be formed between the first source/drain 421, which includes the metal, and the tunable band-gap layer 430. Thus, contact resistance between the first source/drain 421 and the tunable band-gap layer 430 when the ON-voltage is applied to the gate structure 440 may be less than the contact resistance between the first source/drain 421 and the tunable band-gap layer 430 when an OFF-voltage is applied to the gate structure 440. Therefore, the semiconductor device 400 according to an embodiment of the inventive concept may have a high ratio of an ON-current to an OFF-current. For example, the ratio of the ON-current to the OFF-current of the semiconductor device 400 according to an embodiment of the inventive concept may be increased by as much as about 500%, as compared with a ratio of an ON-current to an OFF-current of a general MOSFET.

In addition, when the OFF-voltage is applied to the gate structure 440, the electrostrictive layer 450 may not be deformed. When the electrostrictive layer 450 is not deformed, stress may not be applied to the tunable band-gap layer 430. Accordingly, the band gap of the tunable band-gap layer 430 when the OFF-voltage is applied to the gate structure 440 may be greater than the band gap of the tunable band-gap layer 430 when the ON-voltage is applied to the gate structure 440. Therefore, the generation of electron-hole pairs may be reduced due to the increased band gap, and thus, the GIDL may be reduced. For example, the GIDL of the semiconductor device 400 according to an embodiment of the inventive concept may be reduced by as much as about 30%, as compared with the GIDL of a general MOSFET.

Figure 15:
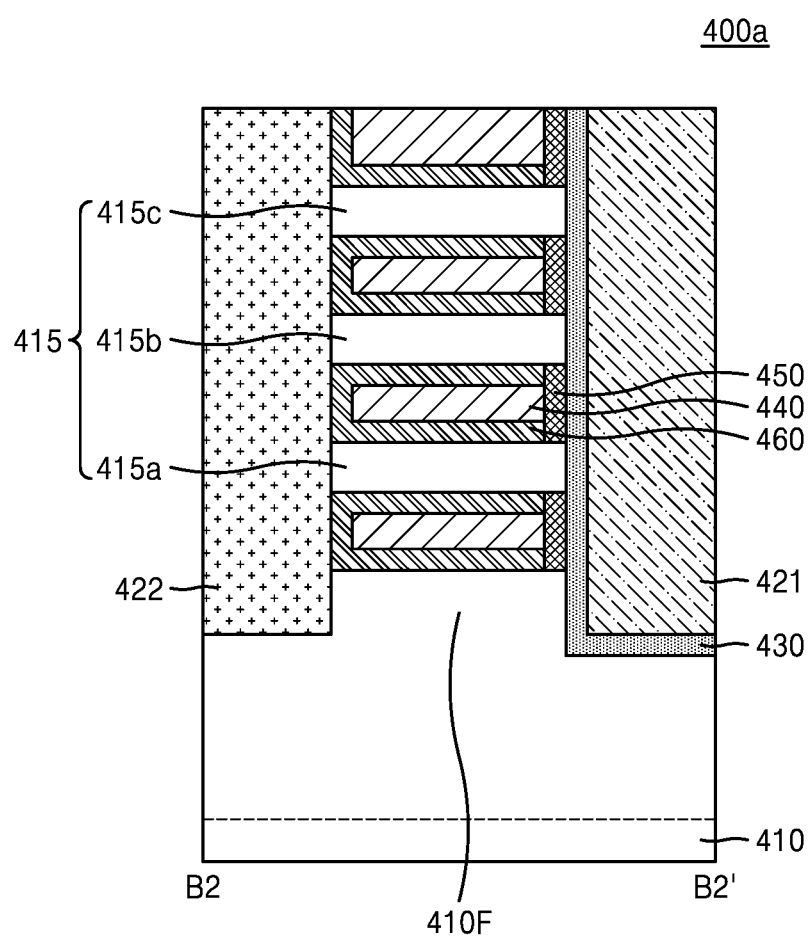
FIG. 15 is a cross-sectional view illustrating a semiconductor device according to an embodiment of the inventive concept.

FIG. 15 is a cross-sectional view illustrating a semiconductor device 400a according to an embodiment of the inventive concept. Hereinafter, differences between the semiconductor device 400 shown in FIGS. 14A to 14C and the semiconductor device 400a shown in FIG. 15 will be described.

Referring to FIG. 15, the semiconductor device 400a may further include a gate dielectric layer 460 between the gate structure 440 and the channel 415, in addition and separate from the electrostrictive layer 450. In some embodiments, the gate dielectric layer 460 may further extend between the gate structure 440 and the second source/drain 422. The gate dielectric layer 460 may include or be formed of silicon oxide, silicon nitride, a high-k material, or a combination thereof.

Figure 16:
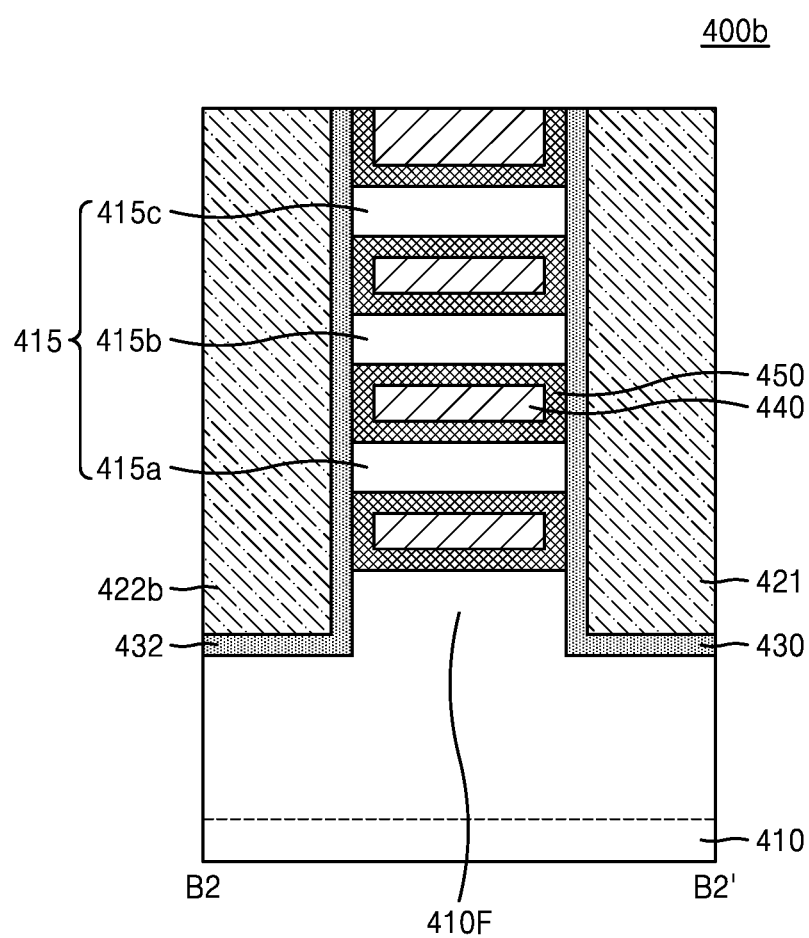
FIG. 16 is a cross-sectional view illustrating a semiconductor device according to an embodiment of the inventive concept.

FIG. 16 is a cross-sectional view illustrating a semiconductor device 400b according to an embodiment of the inventive concept. Hereinafter, differences between the semiconductor device 400 shown in FIGS. 14A to 14C and the semiconductor device 400b shown in FIG. 16 will be described.

Referring to FIG. 16, a second source/drain 422b may include or be formed of a metal. For example, the second source/drain 422b may include or be formed of tungsten (W), aluminum (Al), or a combination thereof.

In addition, the semiconductor device 400b may further include an additional tunable band-gap layer 432 between the second source/drain 422b and the channel 415. The additional tunable band-gap layer 432 may further extend between the gate structure 430 and the second source/drain 422b. The additional tunable band-gap layer 432 may further extend between the fin structure 410F of the substrate 410 and the second source/drain 422b. The additional tunable band-gap layer 432 may have a band gap varying according to stress. For example, the additional tunable band-gap layer 432 may include or be formed of a 2-dimensional material. The additional tunable band-gap layer 432 may include or be formed of, for example, a TMD. For example, the additional tunable band-gap layer 432 may include or be formed of $MX_2$, wherein M is a transition metal such as molybdenum (Mo), tungsten (W), or tin (Sn), and X is a chalcogen element such as sulfur (S), selenium (Se), or tellurium (Te). The additional tunable band-gap layer 432 may include or be formed of a multi-layered 2-dimensional material. For example, the additional tunable band-gap layer 432 may be a plurality of 2-dimensional material atomic layers, which are stacked on each other.

The electrostrictive layer 450 may further extend between the gate structure 440 and the additional tunable band-gap layer 432.

An electric field may be applied to the electrostrictive layer 450 according to the voltage applied to the gate structure 440, and thus, the electrostrictive layer 450 may be deformed. When the electrostrictive layer 450 is deformed, stress applied to each of the tunable band-gap layer 430 and the additional tunable band-gap layer 432 is changed, and band gaps of the tunable band-gap layer 430 and the additional tunable band-gap layer 432 may respectively vary according to the stress.

For example, when the ON-voltage is applied to the gate structure 440, the electrostrictive layer 450 may expand. When the electrostrictive layer 450 expands, stress is applied to each of the tunable band-gap layer 430 and the additional tunable band-gap layer 432, and the respective band gaps of the tunable band-gap layer 430 and the additional tunable band-gap layer 432 may decrease according to the stress. Accordingly, an Ohmic junction may be formed between the first source/drain 421, which includes the metal, and the tunable band-gap layer 430. In addition, an Ohmic junction may be formed between the second source/drain 422b, which includes the metal, and the additional tunable band-gap layer 432. Thus, the contact resistance between the first source/drain 421 and the tunable band-gap layer 430 when the ON-voltage is applied to the gate structure 440 may be less than the contact resistance between the first source/drain 421 and the tunable band-gap layer 430 when the OFF-voltage is applied to the gate structure 440. In addition, contact resistance between the second source/drain 422b and the additional tunable band-gap layer 432 when the ON-voltage is applied to the gate structure 440 may be less than the contact resistance between the second source/drain 422b and the additional tunable band-gap layer 432 when the OFF-voltage is applied to the gate structure 440. Therefore, the semiconductor device 400b according to an embodiment of the inventive concept may have a high ratio of an ON-current to an OFF-current.

In addition, when the OFF-voltage is applied to the gate structure 440, the electrostrictive layer 450 may not be deformed. When the electrostrictive layer 450 is not deformed, stress may not be applied to each of the tunable band-gap layer 430 and the additional tunable band-gap layer 432. Accordingly, the band gap of the tunable band-gap layer 430 when the OFF-voltage is applied to the gate structure 440 may be greater than the band gap of the tunable band-gap layer 430 when the ON-voltage is applied to the gate structure 440. In addition, the band gap of the additional tunable band-gap layer 432 when the OFF-voltage is applied to the gate structure 440 may be greater than the band gap of the additional tunable band-gap layer 432 when the ON-voltage is applied to the gate structure 440. Therefore, the generation of electron-hole pairs may be reduced due to the increased band gap, and thus, the GIDL may be reduced.

Figure 17:
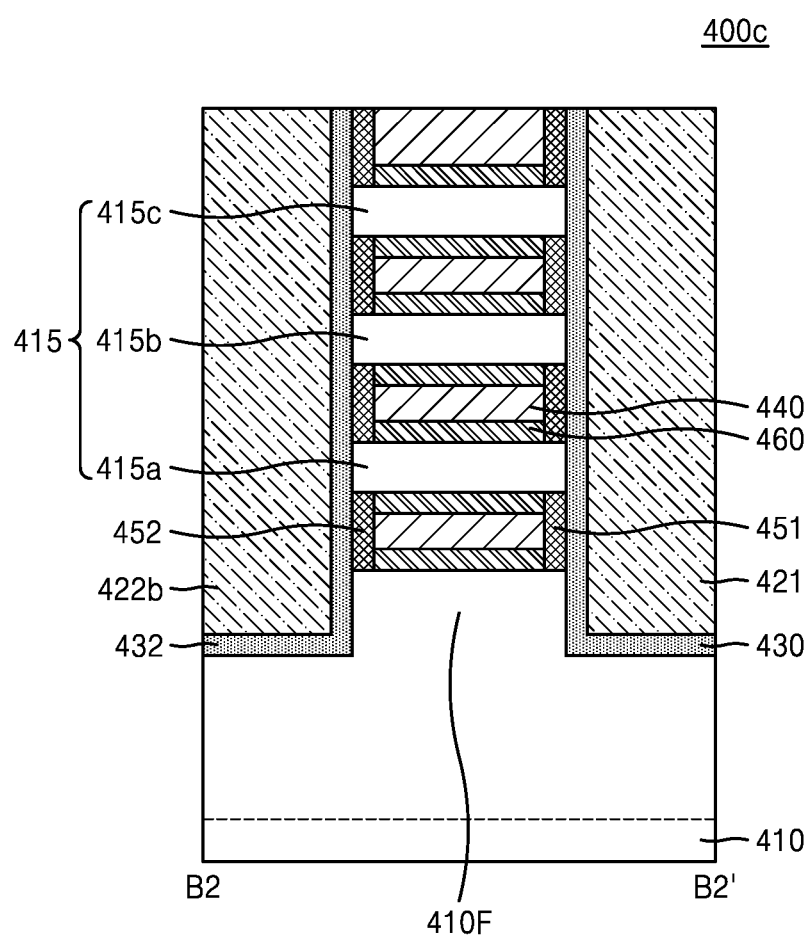
FIG. 17 is a cross-sectional view illustrating a semiconductor device according to an embodiment of the inventive concept.

FIG. 17 is a cross-sectional view illustrating a semiconductor device 400c according to an embodiment of the inventive concept. Hereinafter, differences between the semiconductor device 400b shown in FIG. 16 and the semiconductor device 400c shown in FIG. 17 will be described.

Referring to FIG. 17, the semiconductor device 400c may include a first electrostrictive layer 451 and a second electrostrictive layer 452, instead of the electrostrictive layer 450 shown in FIG. 16. The first electrostrictive layer 451 may be arranged between the gate structure 440 and the tunable band-gap layer 430. The second electrostrictive layer 452 may be arranged between the gate structure 440 and the additional tunable band-gap layer 432. The first electrostrictive layer 451 and the second electrostrictive layer 452 may be deformed according to an electric field. The first electrostrictive layer 451 and the second electrostrictive layer 452 may each include or be formed of, for example, lead magnesium niobate (PMN), lead magnesium niobate-lead titanate (PMN-PT), lead lanthanum zirconate titanate (PLZT), titanate, alkaline niobate, or bismuth perovskite. The first electrostrictive layer 451 and the second electrostrictive layer 452 may each include or be formed of, for example, $Bi_{0.5}Na_{0.5}TiO_3$—$Bi_{0.5}K_{0.5}TiO_3$—$LiTaO_3$ or $Bi_{0.5}(Na_{0.78}K_{0.22})_{0.5}TiO_3$.

The semiconductor device 400c may further include the gate dielectric layer 460 between the first electrostrictive layer 451 and the second electrostrictive layer 452. The gate dielectric layer 460 may be arranged between the channel 415 and the gate structure 440. The gate dielectric layer 460 may include or be formed of silicon oxide, silicon nitride, a high-k material, or a combination thereof.

An electric field may be applied to the first electrostrictive layer 451 and the second electrostrictive layer 452 according to the voltage applied to the gate structure 440, and thus, the first electrostrictive layer 451 and the second electrostrictive layer 452 may be deformed. When the first electrostrictive layer 451 and the second electrostrictive layer 452 are deformed, the stress applied to each of the tunable band-gap layer 430 and the additional tunable band-gap layer 432 is changed, and the band gaps of the tunable band-gap layer 430 and the additional tunable band-gap layer 432 may respectively vary according to the stress.

For example, when the ON-voltage is applied to the gate structure 440, the first electrostrictive layer 451 and the second electrostrictive layer 452 may expand. When the first electrostrictive layer 451 and the second electrostrictive layer 452 expand, stress is applied to each of the tunable band-gap layer 430 and the additional tunable band-gap layer 432, and the respective band gaps of the tunable band-gap layer 430 and the additional tunable band-gap layer 432 may decrease according to the stress. Accordingly, an Ohmic junction may be formed between the first source/drain 421, which includes the metal, and the tunable band-gap layer 430. In addition, an Ohmic junction may be formed between the second source/drain 422b, which includes the metal, and the additional tunable band-gap layer 432. Thus, the contact resistance between the first source/drain 421 and the tunable band-gap layer 430 when the ON-voltage is applied to the gate structure 440 may be less than the contact resistance between the first source/drain 421 and the tunable band-gap layer 430 when the OFF-voltage is applied to the gate structure 440. In addition, the contact resistance between the second source/drain 422b and the additional tunable band-gap layer 432 when the ON-voltage is applied to the gate structure 440 may be less than the contact resistance between the second source/drain 422b and the additional tunable band-gap layer 432 when the OFF-voltage is applied to the gate structure 440. Therefore, the semiconductor device 400c according to an embodiment of the inventive concept may have a high ratio of an ON-current to an OFF-current.

In addition, when the OFF-voltage is applied to the gate structure 440, the first electrostrictive layer 451 and the second electrostrictive layer 452 may not be deformed. When the first electrostrictive layer 451 and the second electrostrictive layer 452 are not deformed, the stress may not be applied to each of the tunable band-gap layer 430 and the additional tunable band-gap layer 432. Accordingly, the band gap of the tunable band-gap layer 430 when the OFF-voltage is applied to the gate structure 440 may be greater than the band gap of the tunable band-gap layer 430 when the ON-voltage is applied to the gate structure 440. In addition, the band gap of the additional tunable band-gap layer 432 when the OFF-voltage is applied to the gate structure 440 may be greater than the band gap of the additional tunable band-gap layer 432 when the ON-voltage is applied to the gate structure 440. Therefore, the generation of electron-hole pairs may be reduced due to the increased band gap, and thus, the GIDL may be reduced.

Figure 18A:
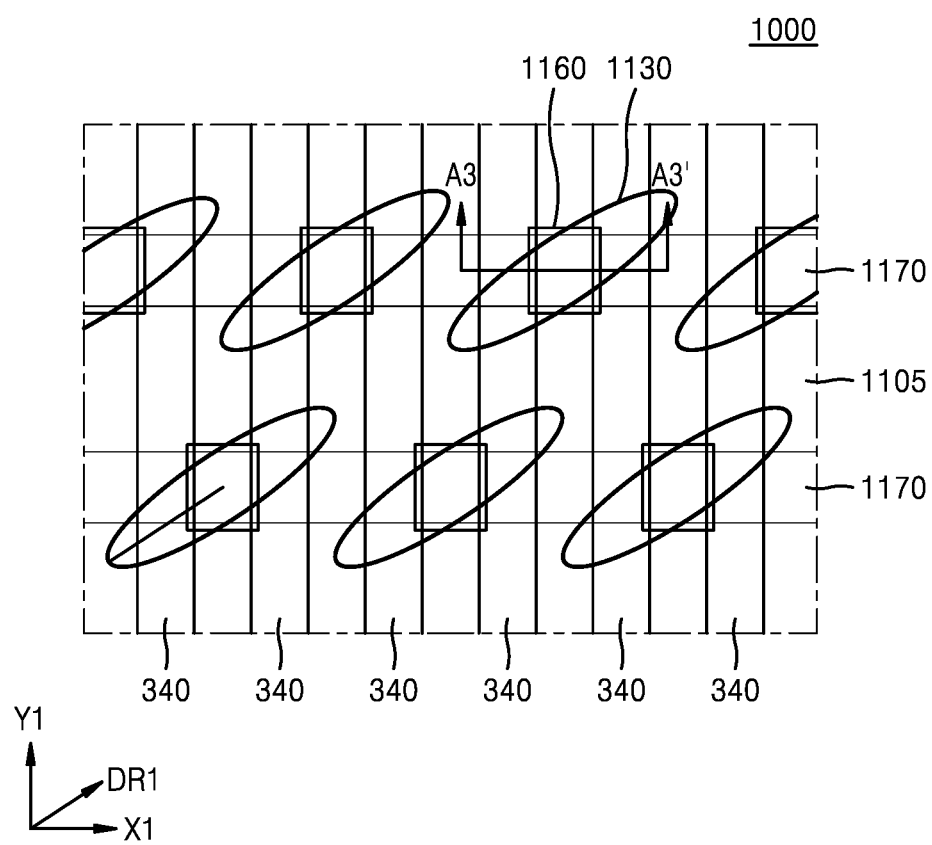
FIG. 18A is a cross-sectional view illustrating a semiconductor device according to an embodiment of the inventive concept.
Figure 18B:
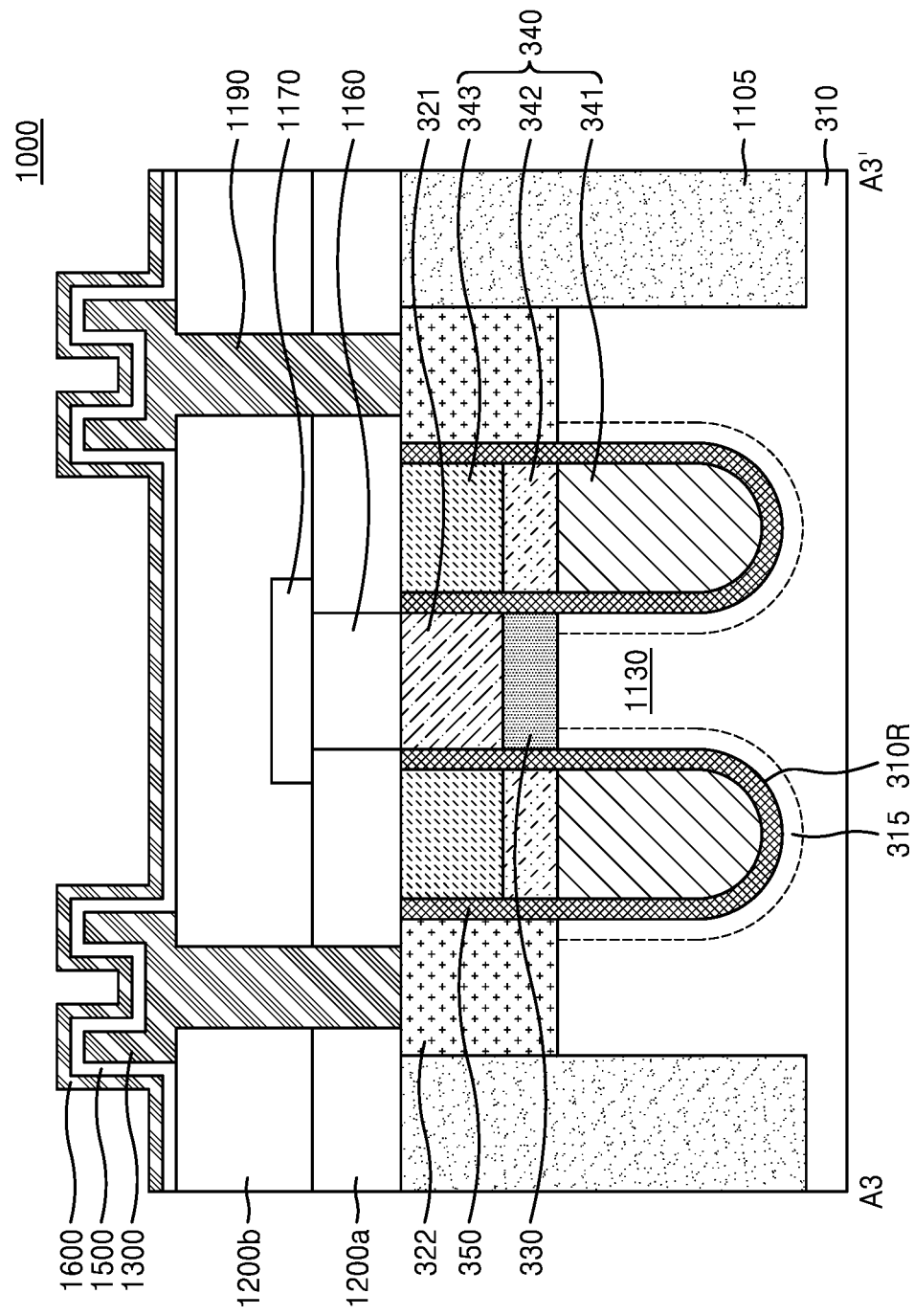
FIG. 18B is a cross-sectional view illustrating a semiconductor device according to an embodiment of the inventive concept, taken along a line A3-A3' of FIG. 18A.

FIG. 18A is a cross-sectional view illustrating a semiconductor device 1000 according to an embodiment of the inventive concept. FIG. 18B is a cross-sectional view illustrating the semiconductor device 1000 according to an embodiment of the inventive concept, taken along a line A3-A3' of FIG. 18A. The semiconductor device 1000 may be, for example, a semiconductor chip such as a memory chip, including a memory cell array formed on a semiconductor die. The semiconductor device 1000 may be, for example, a semiconductor package including a package substrate and one or more semiconductor chips mounted thereon, wherein the one or more semiconductor chips include a memory cell array formed on a semiconductor die.

Referring to FIGS. 18A and 18B, the semiconductor device 1000 may include the channel 315, the gate structure 340, the first source/drain 321, the second source/drain 322, a device isolation layer 1105, a bit line contact 1160, a bit line 1170, a first interlayer insulating layer 1200a, a second interlayer insulating layer 1200b, a capacitor contact 1190, a lower electrode 1300, a capacitor dielectric layer 1500, and an upper electrode 1600.

The substrate 310 may include an active region 1130, and the device isolation layer 1105 may be arranged on the substrate 310 to surround the active region 1130. As shown in FIG. 18A, the active region 1130 may extend in a first direction DR1. Active regions 1130 may be 2-dimensionally arranged in a first horizontal direction X1 and a second horizontal direction Y1. The first direction DR1 may not be parallel to the first horizontal direction X1 or the second horizontal direction Y1. The channel 315 may be a portion of the active region 1130 of the substrate 310. The substrate 310 may have a plurality of recesses 310R extending parallel to each other in the second horizontal direction Y1. More detailed descriptions of the substrate 310 are the same as described with reference to FIG. 9. The device isolation layer 1105 may include or be formed of silicon oxide, silicon nitride, a low-k material, or a combination thereof.

A plurality of gate structures 340 may be arranged in the plurality of recesses 310R of the substrate 310 and extend parallel to each other in the second horizontal direction Y1. One active region 1130 may intersect with two gate structures 340. More detailed descriptions of the gate structure 340 are the same as described with reference to FIG. 9.

The first source/drain 321 may be arranged on the active region 1130 and arranged between two gate structures 340. More detailed descriptions of the first source/drain 321 are the same as described with reference to FIG. 9. Descriptions of the tunable band-gap layer 330 are the same as described with reference to FIG. 9. Descriptions of the electrostrictive layer 350 are the same as described with reference to FIG. 9.

A pair of second source/drains 322 may be arranged at both ends of the active region 1130. More detailed descriptions of the pair of second source/drains 322 are the same as described with reference to FIG. 9.

The bit line contact 1160 may be arranged on the first source/drain 321. The bit line 1170 may be arranged on the bit line contact 1160 and extend in the first horizontal direction X1. The first interlayer insulating layer 1200a may surround the bit line contact 1160. The second interlayer insulating layer 1200b may be arranged on the first interlayer insulating layer 1200a to cover the bit line 1170. The first interlayer insulating layer 1200a and the second interlayer insulating layer 1200b may each include or be formed of silicon oxide, silicon nitride, a low-k material, or a combination thereof.

The capacitor contact 1190 may contact the second source/drain 322 through the first interlayer insulating layer 1200a and the second interlayer insulating layer 1200b. The capacitor contact 1190 may include or be formed of, for example, tungsten (W).

The lower electrode 1300 may be arranged on the capacitor contact 1190. The lower electrode 1300 may have a cylindrical shape. The lower electrode 1300 may include or be formed of titanium nitride, tantalum nitride, tungsten, ruthenium, platinum, or a combination thereof.

The capacitor dielectric layer 1500 may conformally cover the lower electrode 1300 and the second interlayer insulating layer 1200b. The capacitor dielectric layer 1500 may include or be formed of silicon oxide, silicon nitride, a high-k material, or a combination thereof.

The upper electrode 1600 may cover the capacitor dielectric layer 1500. The upper electrode 1600, the capacitor dielectric layer 1500, and the lower electrode 1300 may form a capacitor. The upper electrode 1600 may include or may be formed of titanium nitride, tantalum nitride, tungsten, ruthenium, platinum, or a combination thereof.

Figure 19:
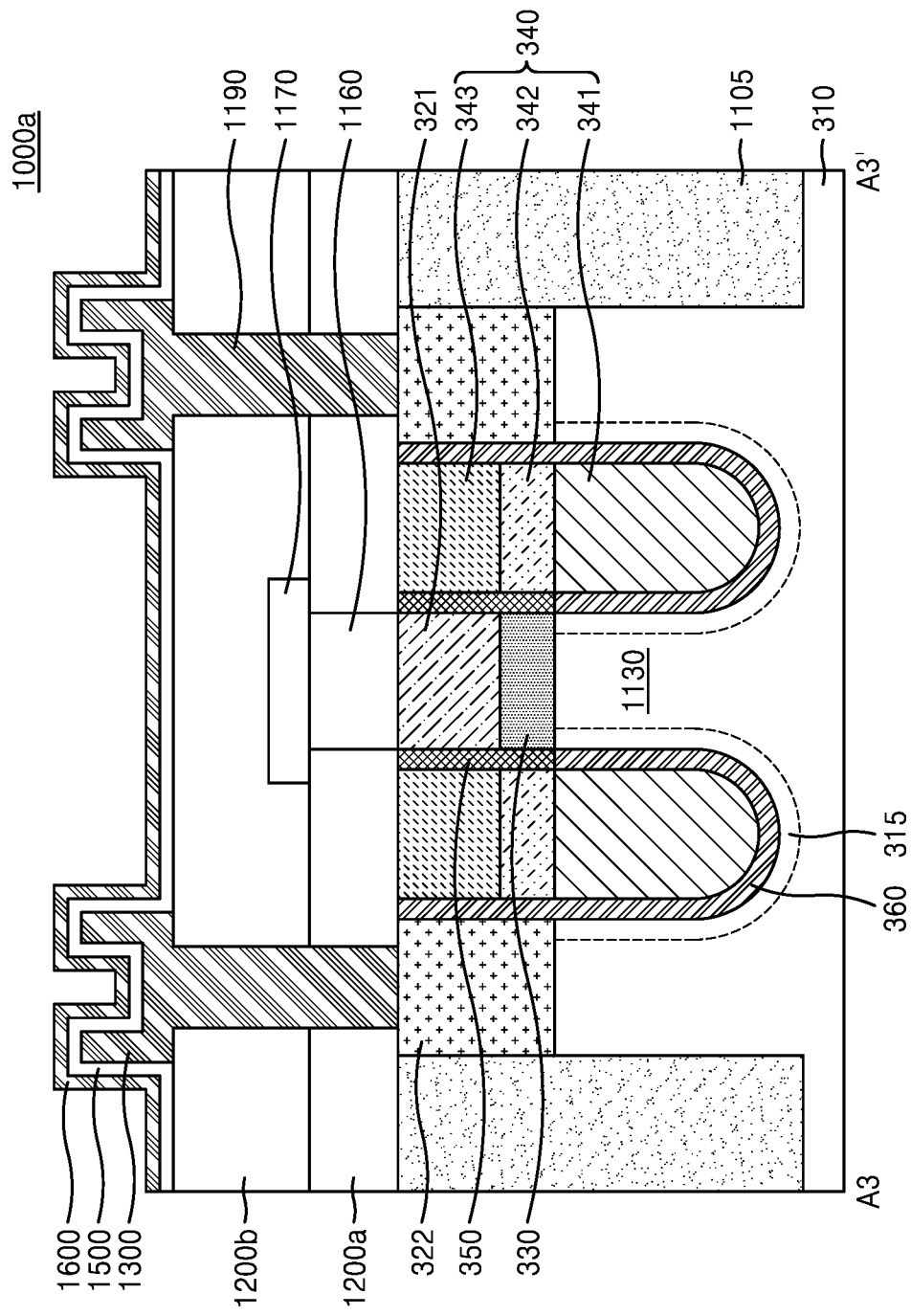
FIG. 19 is a cross-sectional view illustrating a semiconductor device according to an embodiment of the inventive concept.

FIG. 19 is a cross-sectional view illustrating a semiconductor device 1000a according to an embodiment of the inventive concept. Hereinafter, differences between the semiconductor device 1000 shown in FIGS. 18A and 18B and the semiconductor device 1000a shown in FIG. 19 will be described.

Referring to FIG. 19, the semiconductor device 1000a may further include the gate dielectric layer 360 between the gate structure 340 and the channel 315. The gate dielectric layer 360 may be in addition to the electrostrictive layer 350. The gate dielectric layer 360 may further extend between the second source/drain 322 and the gate structure 340. More detailed descriptions of the gate dielectric layer 360 are the same as described with reference to FIG. 10.

Figure 20:
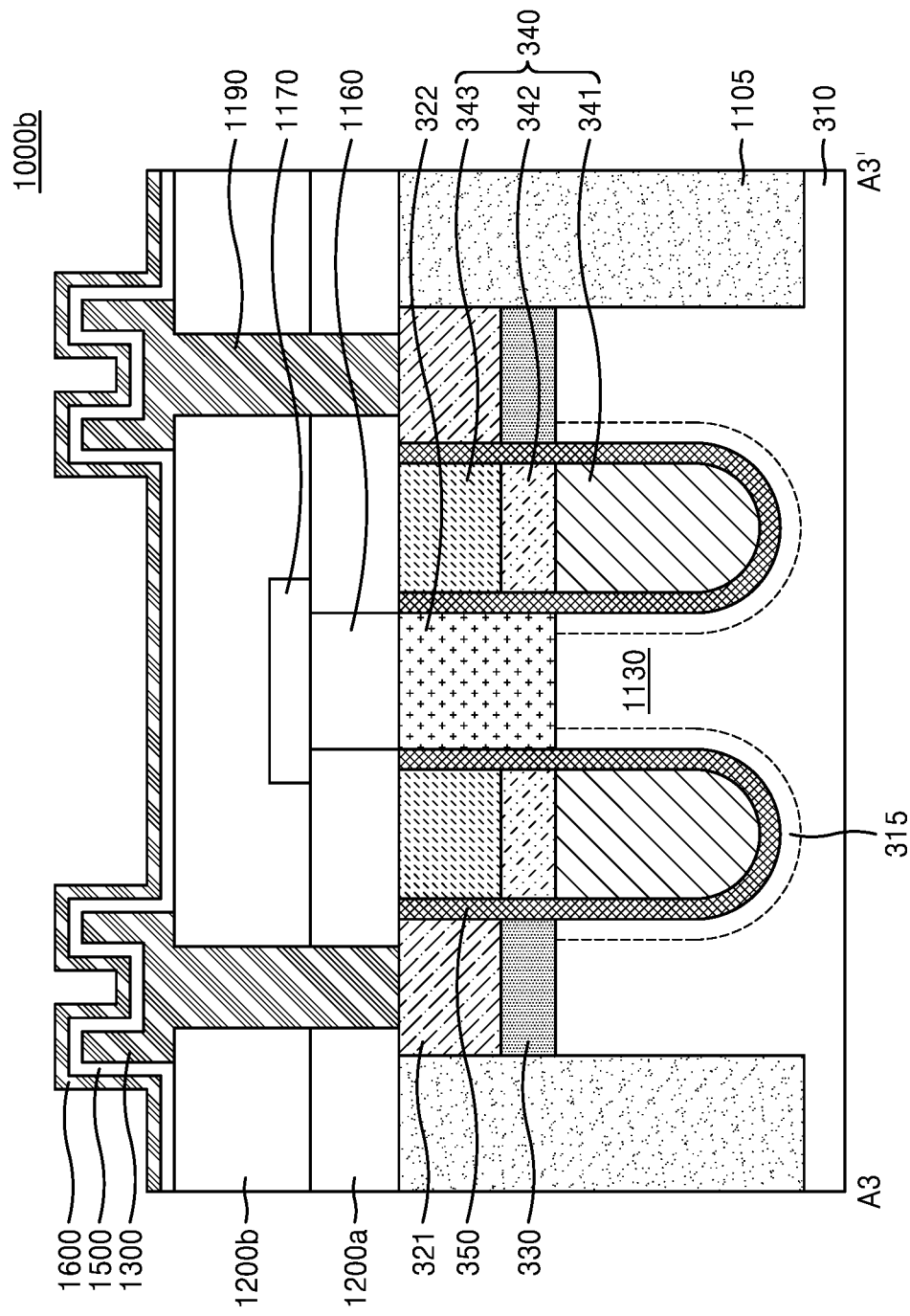
FIG. 20 is a cross-sectional view illustrating a semiconductor device according to an embodiment of the inventive concept.

FIG. 20 is a cross-sectional view illustrating a semiconductor device 1000b according to an embodiment of the inventive concept. Hereinafter, differences between the semiconductor device 1000 shown in FIGS. 18A and 18B and the semiconductor device 1000b shown in FIG. 20 will be described.

Referring to FIG. 20, a pair of first source/drains 321 may be arranged at both ends of the active region 1130, and the second source/drain 322 may be arranged between two gate structures 340. A pair of capacitor contacts 1190 may respectively contact the pair of first source/drains 321, and the bit line contact 1160 may contact the second source/drain 322.

Figure 21:
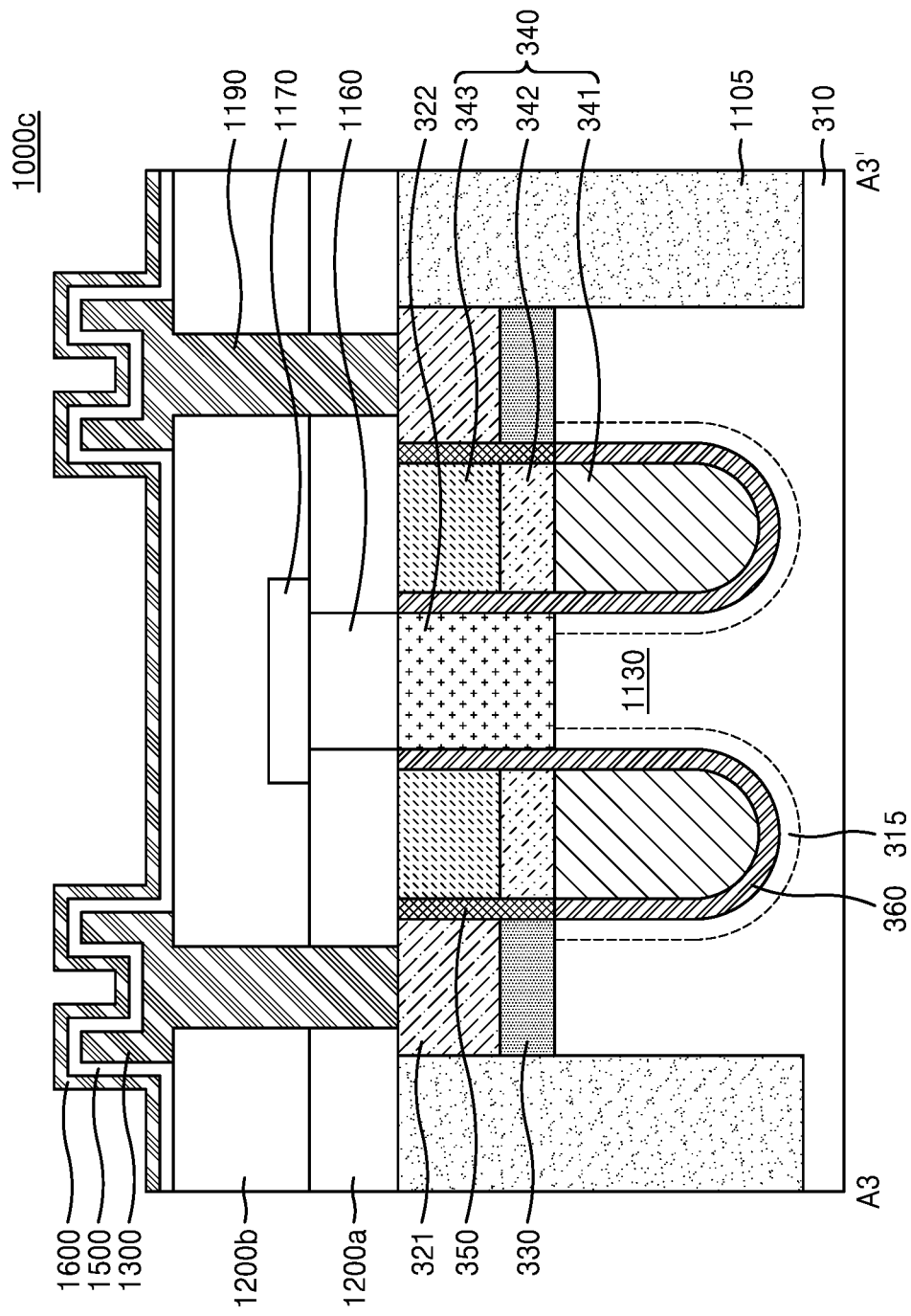
FIG. 21 is a cross-sectional view illustrating a semiconductor device according to an embodiment of the inventive concept.

FIG. 21 is a cross-sectional view illustrating a semiconductor device 1000c according to an embodiment of the inventive concept. Hereinafter, differences between the semiconductor device 1000b shown in FIG. 20 and the semiconductor device 1000c shown in FIG. 21 will be described.

Referring to FIG. 21, the semiconductor device 1000c may further include the gate dielectric layer 360 between the gate structure 340 and the channel 315. The gate dielectric layer 360 may further extend between the gate structure 340 and the second source/drain 322. More detailed descriptions of the gate dielectric layer 360 are the same as described with reference to FIG. 10.

Figure 22:
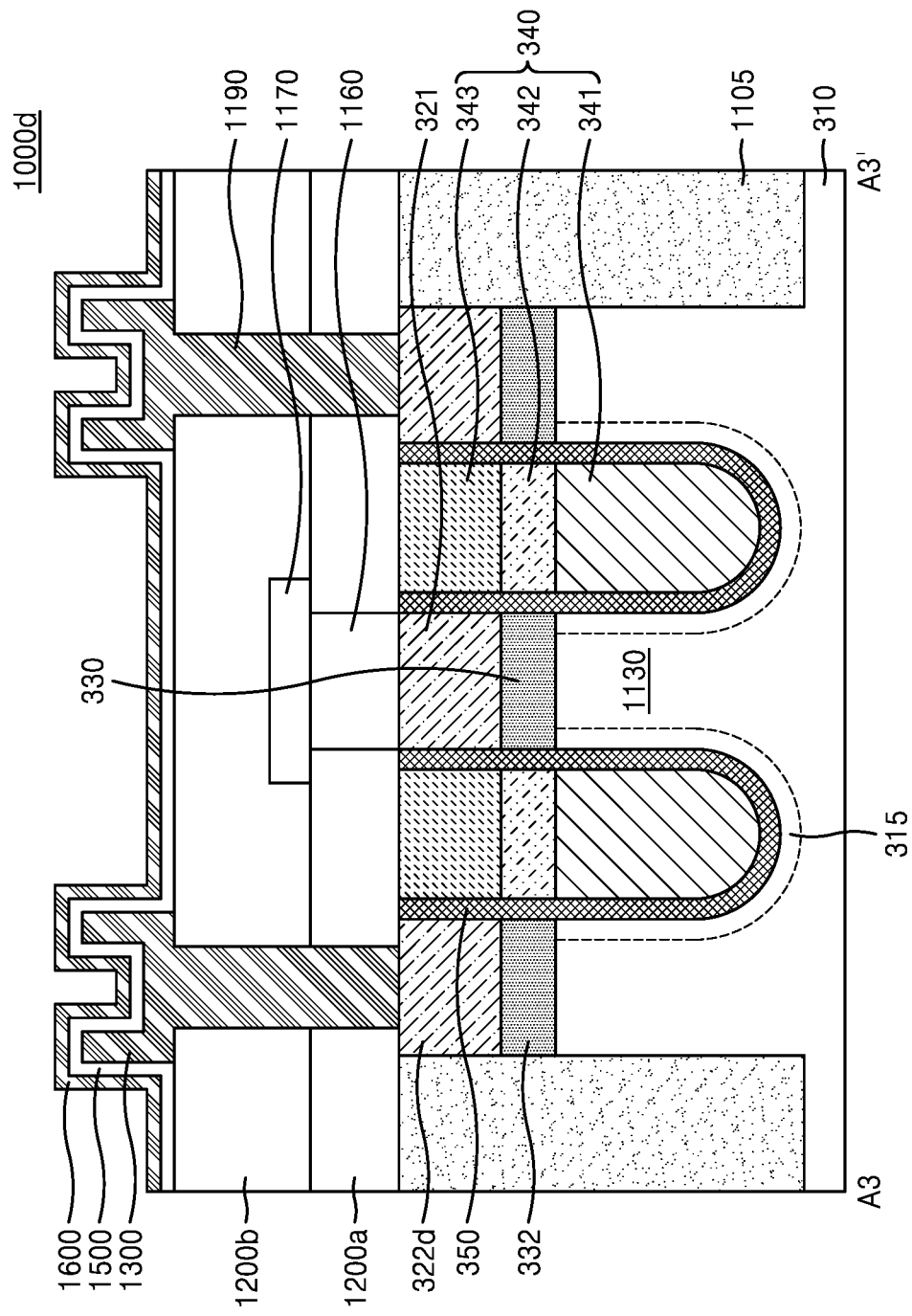
FIG. 22 is a cross-sectional view illustrating a semiconductor device according to an embodiment of the inventive concept.

FIG. 22 is a cross-sectional view illustrating a semiconductor device 1000d according to an embodiment of the inventive concept. Hereinafter, differences between the semiconductor device 1000 shown in FIGS. 18A and 18B and the semiconductor device 1000d shown in FIG. 22 will be described.

Referring to FIG. 22, the second source/drain 322d may include or be formed of a metal. For example, the second source/drain 322d may include or be formed of tungsten (W), aluminum (Al), or a combination thereof. In addition, the semiconductor device 1000d may further include the additional tunable band-gap layer 332 between the second source/drain 322d and the channel 315. More detailed descriptions of the additional tunable band-gap layer 332 are the same as described with reference to FIG. 11. The electrostrictive layer 350 may further extend between the gate structure 340 and the additional tunable band-gap layer 332.

Figure 23:
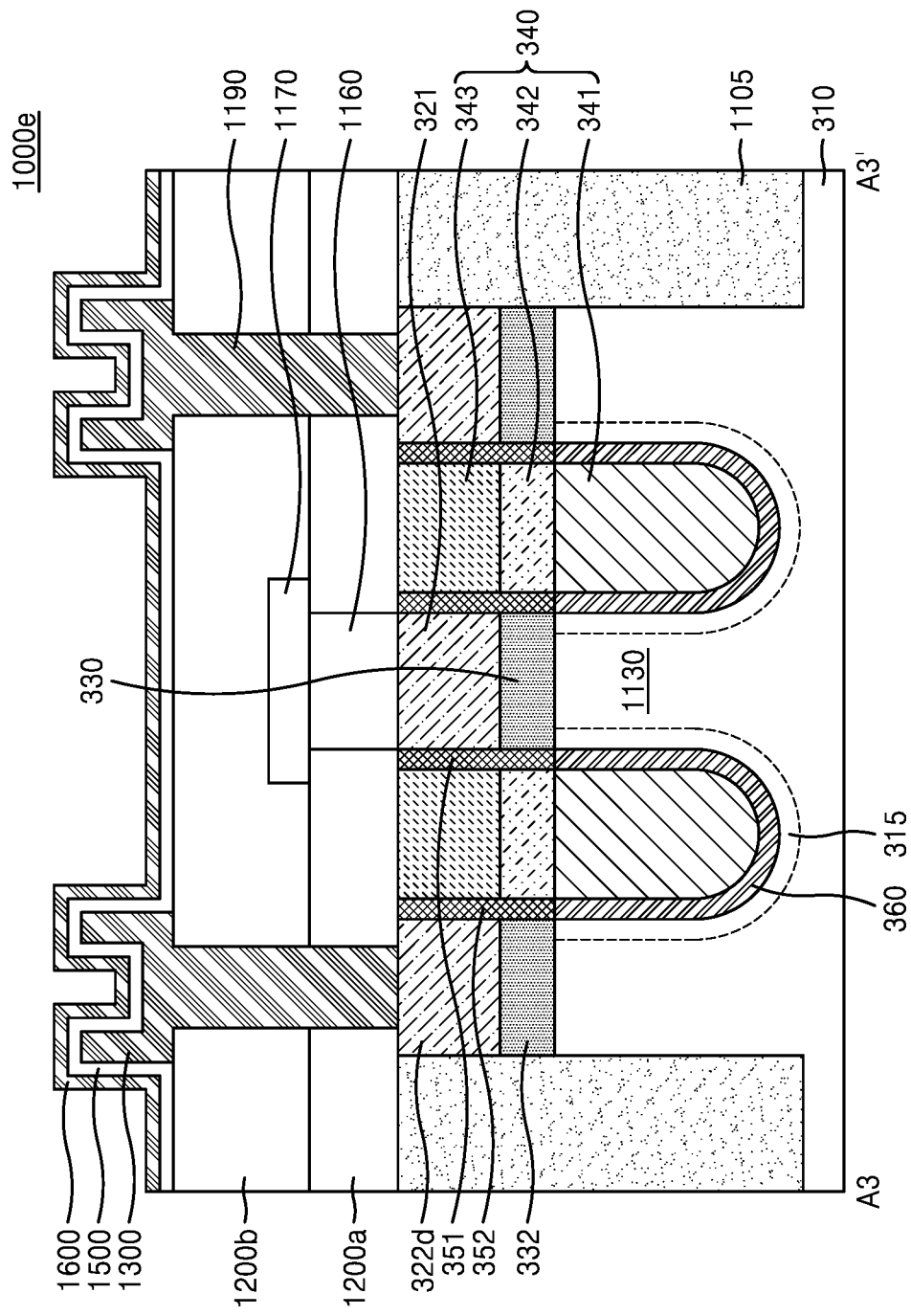
FIG. 23 is a cross-sectional view illustrating a semiconductor device according to an embodiment of the inventive concept.

FIG. 23 is a cross-sectional view illustrating a semiconductor device 1000e according to an embodiment of the inventive concept. Hereinafter, differences between the semiconductor device 1000d shown in FIG. 22 and the semiconductor device 1000e shown in FIG. 23 will be described.

Referring to FIG. 23, the semiconductor device 1000e may include the first electrostrictive layer 351 and the second electrostrictive layer 352, instead of the electrostrictive layer 350 shown in FIG. 22. More detailed descriptions of the first electrostrictive layer 351 and the second electrostrictive layer 352 are the same as described with reference to FIG. 12. The semiconductor device 1000e may further include the gate dielectric layer 360. More detailed descriptions of the gate dielectric layer 360 are the same as described with reference to FIG. 12.

FIGS. 24A to 24E are cross-sectional views illustrating a method of manufacturing a semiconductor device, according to an embodiment of the inventive concept.

Figure 24A:
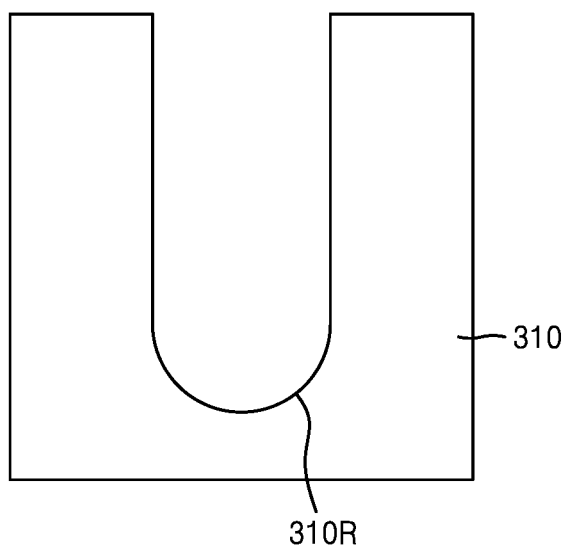
FIGS. 24A to 24E are cross-sectional views illustrating a method of manufacturing a semiconductor device, according to an embodiment of the inventive concept.

Referring to FIG. 24A, the recess 310R is formed in the substrate 310. For example, the recess 310R may be formed by selectively etching the substrate 310.

Figure 24B:
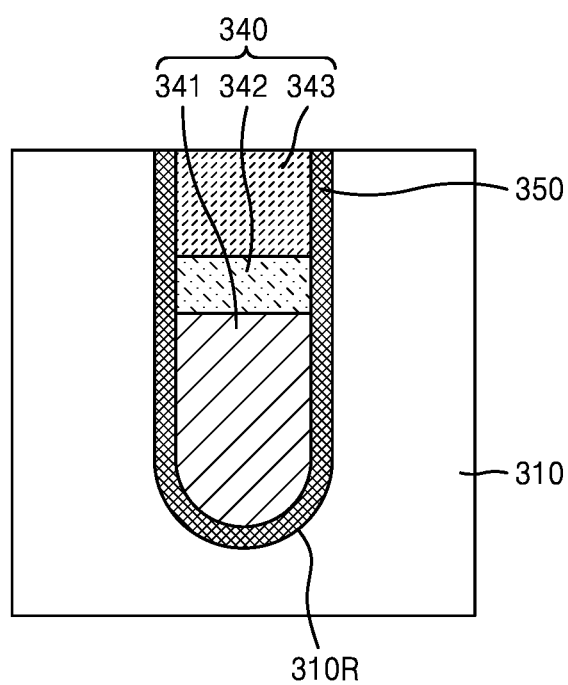

Referring to FIG. 24B, the electrostrictive layer 350 is formed in the recess 310R of the substrate 310. Next, the gate structure 340 is formed on the electrostrictive layer 350. For example, the metal layer 341 may be formed on the electrostrictive layer 350 and then be etched back. Next, the polysilicon layer 342 may be formed on the metal layer 341 and the electrostrictive layer 350 and then be etched back. Next, the gate capping layer 343 may be formed on the polysilicon layer 342 and the electrostrictive layer 350 and then be polished or etched back.

Figure 24C:
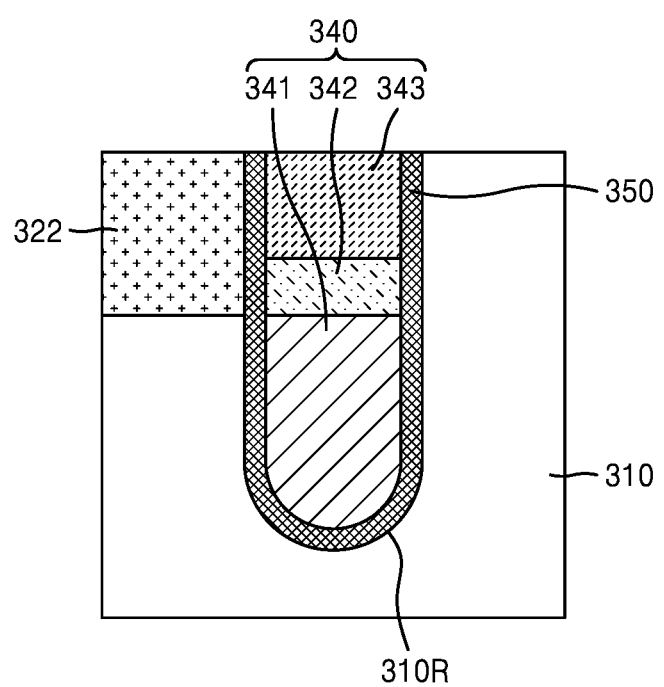

Referring to FIG. 24C, the second source/drain 322 is formed in the substrate 310 at one side of the gate structure 340. For example, the second source/drain 322 may be formed by doping a portion of the substrate 310 with impurities.

Figure 24D:
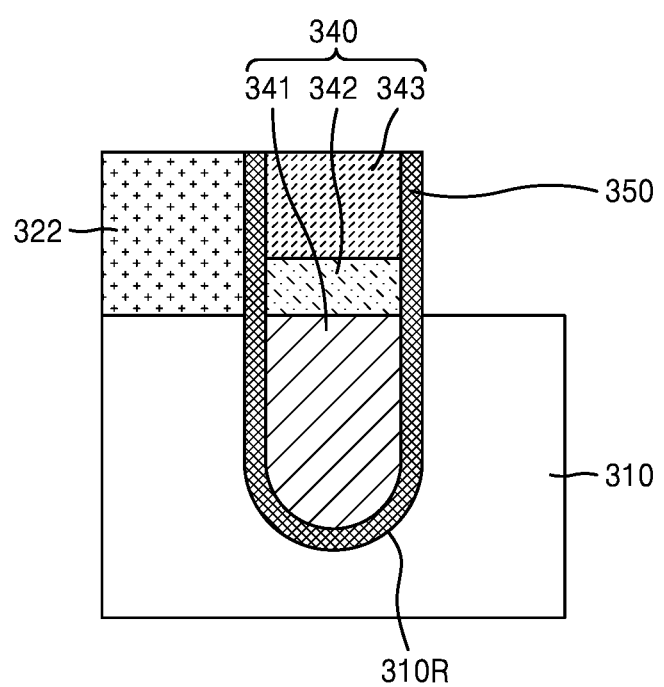

Referring to FIG. 24D, a portion of the substrate 310 at the other side of the gate structure 340 is etched.

Figure 24E:
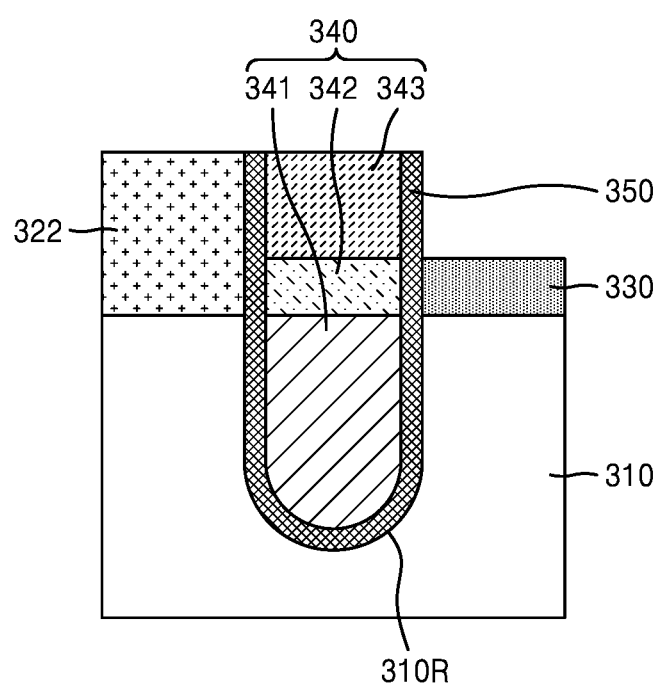

Referring to FIG. 24E, the tunable band-gap layer 330 is formed on the substrate 310 at the other side of the gate structure 340.

Referring to FIG. 9, the first source/drain 321 may be formed on the tunable band-gap layer 330. In this way, the semiconductor device 300 shown in FIG. 9 may be manufactured.

FIGS. 25A to 25F are cross-sectional views illustrating a method of manufacturing a semiconductor device, according to an embodiment of the inventive concept.

Figure 25A:
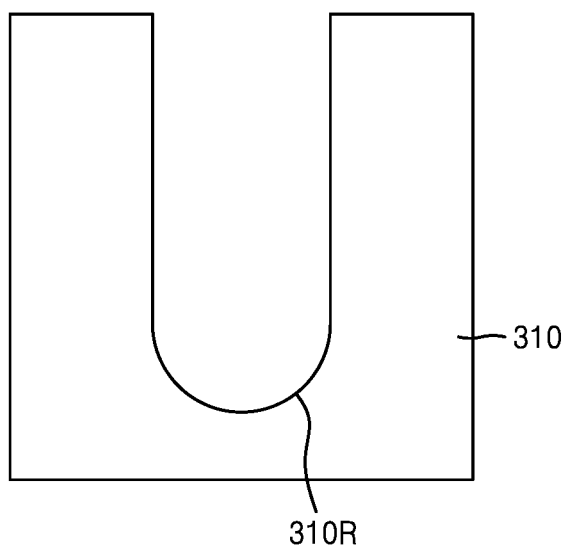
FIGS. 25A to 25F are cross-sectional views illustrating a method of manufacturing a semiconductor device, according to an embodiment of the inventive concept.

Referring to FIG. 25A, the recess 310R is formed in the substrate 310. For example, the recess 310R may be formed by selectively etching the substrate 310.

Figure 25B:
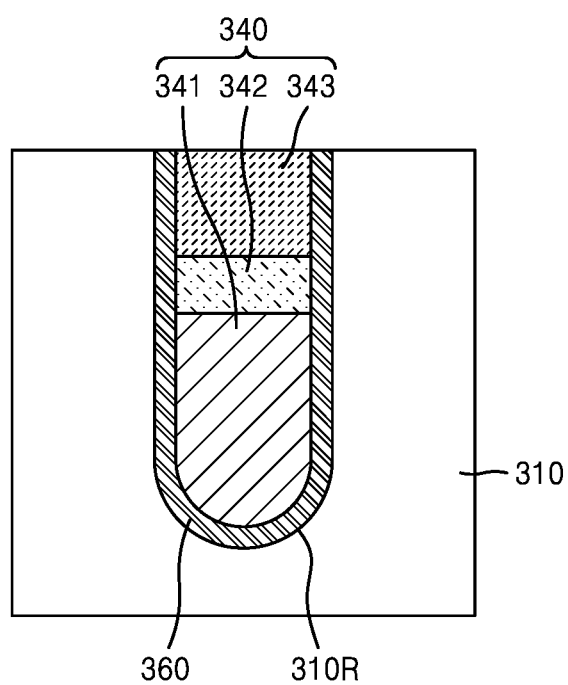

Referring to FIG. 25B, the gate dielectric layer 360 is formed in the recess 310R of the substrate 310. Next, the gate structure 340 is formed on the gate dielectric layer 360. For example, the metal layer 341 may be formed on the gate dielectric layer 360 and then be etched back. Next, the polysilicon layer 342 may be formed on the metal layer 341 and the gate dielectric layer 360 and then be etched back. Next, the gate capping layer 343 may be formed on the polysilicon layer 342 and the gate dielectric layer 360 and then be polished or etched back.

Figure 25C:
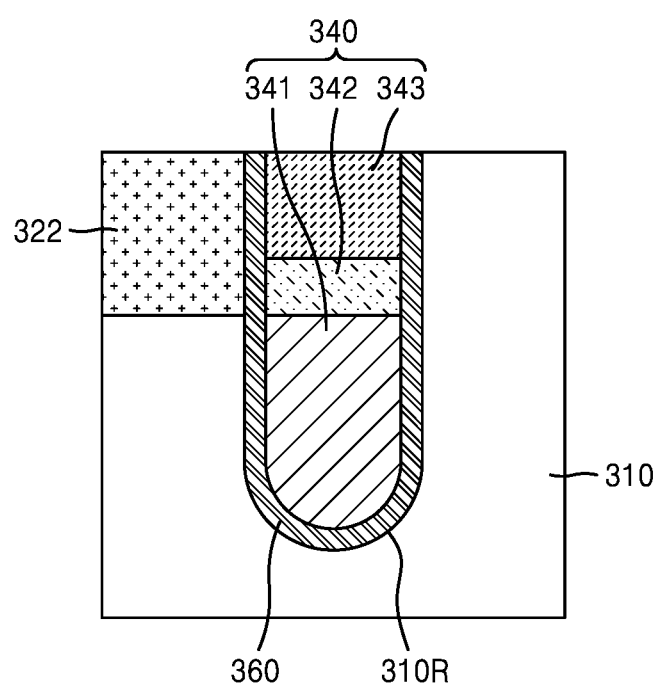

Referring to FIG. 25C, the second source/drain 322 is formed in the substrate 310 at one side of the gate structure 340. For example, the second source/drain 322 may be formed by doping a portion of the substrate 310 with impurities.

Figure 25D:
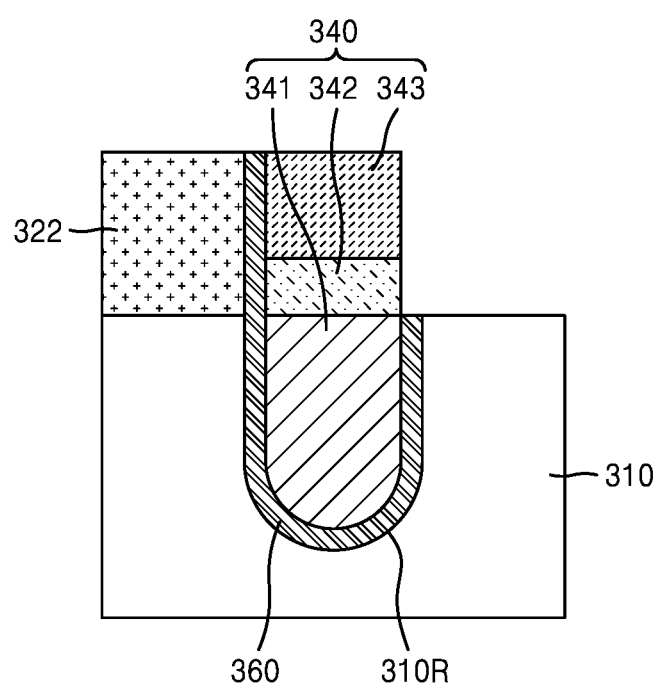

Referring to FIG. 25D, a portion of the substrate 310 at the other side of the gate structure 340 is etched. In addition, a portion of the gate dielectric layer 360 at the other side of the gate structure 340 is etched.

Figure 25E:
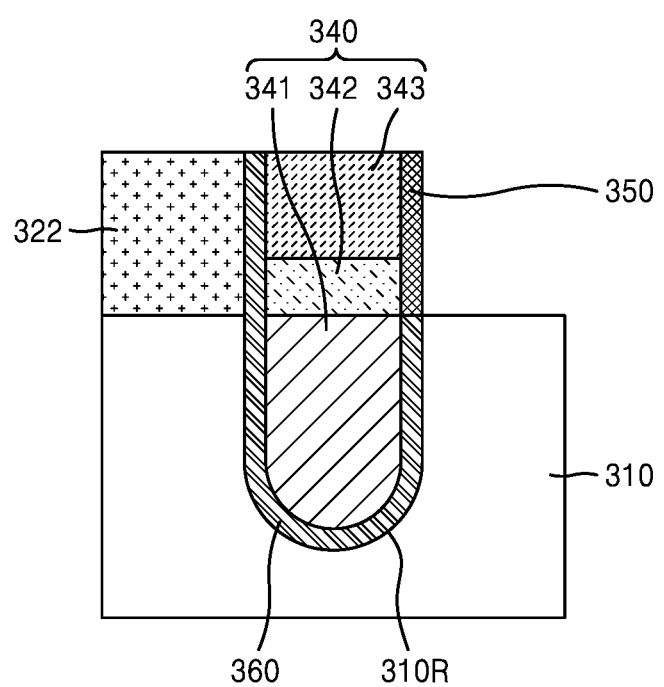

Referring to FIG. 25E, the electrostrictive layer 350 is formed at the other side of the gate structure 340. For example, the electrostrictive layer 350 may be formed on the gate structure 340 and the substrate 310 and then anisotropically etched.

Figure 25F:
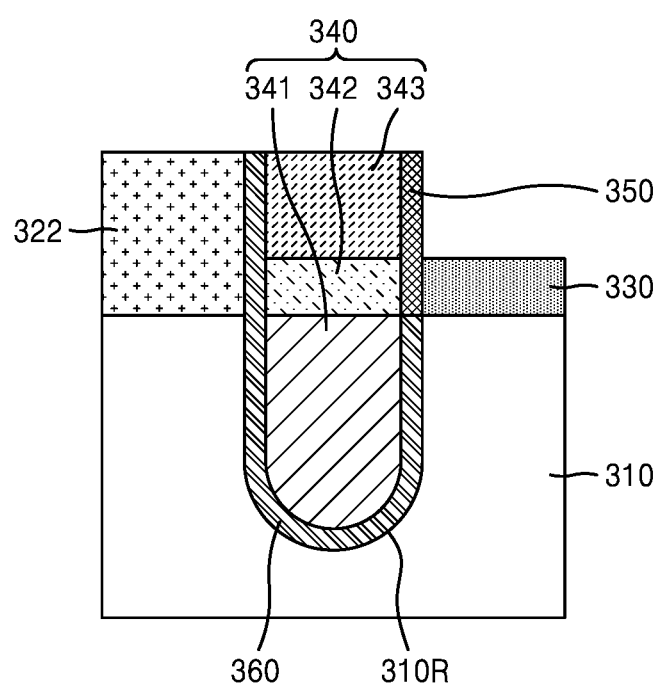

Referring to FIG. 25F, the tunable band-gap layer 330 is formed on the substrate 310 at the other side of the gate structure 340.

Referring to FIG. 10, the first source/drain 321 may be formed on the tunable band-gap layer 330. In this way, the semiconductor device 300a shown in FIG. 10 may be manufactured.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a channel;
   a gate structure on the channel;
   a first source/drain at a first end of the channel, the first source/drain comprising a metal;
   a first tunable band-gap layer between the channel and the first source/drain, the first tunable band-gap layer having a band gap that varies according to stress;
   a first electrostrictive layer between the gate structure and the first tunable band-gap layer, the first electrostrictive layer having a property of being deformed based on and upon application of an electric field; and
   a second source/drain at a second end of the channel.

2. The semiconductor device of claim 1, wherein the band gap of the first tunable band-gap layer varies according to a voltage applied to the gate structure.

3. The semiconductor device of claim 1, wherein:
   contact resistance between the first source/drain and the first tunable band-gap layer when an ON-voltage is applied to the gate structure is less than the contact resistance between the first source/drain and the first tunable band-gap layer when an OFF-voltage is applied to the gate structure, and
   the first source/drain and the first tunable band-gap layer form an Ohmic junction, when the ON-voltage is applied to the gate structure.

4. The semiconductor device of claim 1, wherein the band gap of the first tunable band-gap layer when an OFF-voltage is applied to the gate structure is greater than the band gap of the first tunable band-gap layer when an ON-voltage is applied to the gate structure.

5. The semiconductor device of claim 1, wherein the first tunable band-gap layer comprises a multi-layered 2-dimensional material.

6. The semiconductor device of claim 1, further comprising:
   a gate dielectric layer between the channel and the gate structure.

7. The semiconductor device of claim 1, wherein the first electrostrictive layer extends between the channel and the gate structure.

8. The semiconductor device of claim 1, wherein:
the second source/drain comprises a metal, and
the semiconductor device further comprises a second tunable band-gap layer between the channel and the second source/drain, the second tunable band-gap layer having a band gap that varies according to stress.

9. The semiconductor device of claim 8, wherein the first electrostrictive layer extends between the gate structure and the second tunable band-gap layer.

10. The semiconductor device of claim 8, further comprising:
a second electrostrictive layer between the gate structure and the second tunable band-gap layer.

11. The semiconductor device of claim 8, wherein the band gap of the second tunable band-gap layer varies according to a voltage applied to the gate structure.

12. The semiconductor device of claim 8, wherein:
contact resistance between the second source/drain and the second tunable band-gap layer when an ON-voltage is applied to the gate structure is less than the contact resistance between the second source/drain and the second tunable band-gap layer when an OFF-voltage is applied to the gate structure, and
the second source/drain and the second tunable band-gap layer form an Ohmic junction, when the ON-voltage is applied to the gate structure.

13. The semiconductor device of claim 8, wherein the band gap of the second tunable band-gap layer when an OFF-voltage is applied to the gate structure is greater than the band gap of the second tunable band-gap layer when an ON-voltage is applied to the gate structure.

14. The semiconductor device of claim 8, wherein the second tunable band-gap layer comprises a multi-layered 2-dimensional material.

15. The semiconductor device of claim 1, further comprising
a semiconductor substrate that has a fin structure protruding from a main surface of the semiconductor substrate, wherein the channel comprises at least a portion of the fin structure of the semiconductor substrate.

16. The semiconductor device of claim 1, further comprising:
a semiconductor substrate including a recess recessed from a main surface of the semiconductor substrate, wherein the channel comprises a portion around the recess of the semiconductor substrate.

17. The semiconductor device of claim 16, wherein the first electrostrictive layer extends between the gate structure and the first source/drain.

18. The semiconductor device of claim 1, wherein:
the channel comprises a plurality of portions apart from each other, and
the gate structure surrounds the plurality of portions of the channel.

19. A semiconductor device comprising:
a semiconductor substrate having a recess;
a gate structure in the recess of the semiconductor substrate;
a first source/drain on the semiconductor substrate at a first side of the gate structure, the first source/drain comprising a metal;
a 2-dimensional material layer between the semiconductor substrate and the first source/drain;
an electrostrictive layer between the gate structure and the 2-dimensional material layer, the electrostrictive layer having a property of being deformed based on and upon application of an electric field; and
a second source/drain on the semiconductor substrate at a second side of the gate structure opposite the first side.

20. A semiconductor device comprising:
a semiconductor substrate having a recess;
a gate structure in the recess of the semiconductor substrate;
a tunable band-gap layer between the semiconductor substrate and the gate structure, the tunable band-gap layer having a band gap that varies according to stress;
an electrostrictive layer between the tunable band-gap layer and the gate structure, the electrostrictive layer having a property of being deformed based on and upon application of an electric field;
a first source/drain at a first end of the tunable band-gap layer; and
a second source/drain at a second end of the tunable band-gap layer.

* * * * *